United States Patent
Wado et al.

(10) Patent No.: US 7,730,785 B2
(45) Date of Patent: Jun. 8, 2010

(54) ULTRASONIC SENSOR AND MANUFACTURE METHOD OF THE SAME

(75) Inventors: Hiroyuki Wado, Toyota (JP); Makiko Sugiura, Hekinan (JP)

(73) Assignee: Denso Corporation, Kariya (JP)

(*) Notice: Subject to any disclaimer, the term of this patent is extended or adjusted under 35 U.S.C. 154(b) by 444 days.

(21) Appl. No.: 11/790,298

(22) Filed: Apr. 24, 2007

(65) Prior Publication Data

US 2007/0251324 A1   Nov. 1, 2007

(30) Foreign Application Priority Data

Apr. 26, 2006   (JP)   ............... 2006-122577
Apr. 26, 2006   (JP)   ............... 2006-122578

(51) Int. Cl.
*G01N 9/24*   (2006.01)
*H01L 41/00*  (2006.01)

(52) U.S. Cl. ............... 73/639; 73/647; 73/649; 310/311; 310/320

(58) Field of Classification Search ............... 73/639, 73/647, 639.596; 310/311, 320, 323.06, 310/339
See application file for complete search history.

(56) References Cited

U.S. PATENT DOCUMENTS

| | | | |
|---|---|---|---|
| 5,142,921 A * | 9/1992 | Stewart et al. ............... 73/866.1 |
| 6,658,948 B2 | 12/2003 | Yoshihara et al. | |
| 7,098,574 B2 * | 8/2006 | Iwata .................. 310/320 |
| 7,329,975 B2 * | 2/2008 | Sugiura et al. ............ 310/334 |
| 7,466,064 B2 * | 12/2008 | Sugiura et al. ............ 310/324 |
| 7,498,716 B2 * | 3/2009 | Watanabe et al. ......... 310/317 |
| 2006/0043843 A1 | 3/2006 | Sugiura et al. | |
| 2006/0186762 A1 | 8/2006 | Sugiura et al. | |
| 2009/0295876 A1 * | 12/2009 | Kobayashi et al. ......... 347/71 |

FOREIGN PATENT DOCUMENTS

| JP | A-2-34972 | 2/1990 |
|---|---|---|
| JP | A-10-22509 | 1/1998 |
| JP | A-11-304617 | 11/1999 |
| JP | A-2001-267588 | 9/2001 |
| JP | A-2003-284182 | 10/2003 |
| JP | A-2005-51687 | 2/2005 |
| JP | A-2005-51690 | 2/2005 |
| JP | B2-3675312 | 5/2005 |

* cited by examiner

*Primary Examiner*—J M Saint Surin
(74) *Attorney, Agent, or Firm*—Posz Law Group, PLC

(57) ABSTRACT

An ultrasonic sensor is provided with a substrate unit where a thin-walled portion is arranged and a piezoelectric oscillator which is formed at the substrate unit. The piezoelectric oscillator includes two electrodes and a piezoelectric film positioned between the two electrodes. The thin-walled portion and the piezoelectric oscillator construct a membrane structure which will resonate at a predetermined frequency.

42 Claims, 14 Drawing Sheets

MAXIMUM DEFORMATION AMOUNT

WIDTH OF EACH STRESS PORTION/
THICKNESS OF MEMBRANE STRUCTURE

ULTRASONIC SENSOR AND MANUFACTURE METHOD OF THE SAME

CROSS REFERENCE TO RELATED APPLICATION

This application is based on a Japanese Patent Application No. 2006-122577 filed on Apr. 26, 2006 and a Japanese Patent Application No. 2006-122578 filed on Apr. 26, 2006, the disclosure of which is incorporated herein by reference.

FIELD OF THE INVENTION

The present invention relates to an ultrasonic sensor and a manufacture method of the same.

BACKGROUND OF THE INVENTION

Generally, an ultrasonic sensor is used for an obstacle detection system of a vehicle. Fore example, with reference to JP-2003-284182A, an ultrasonic sensor of a piezoelectric type which is manufactured by a MEMS (micro electro mechanical system) technology is disclosed.

In this case, the ultrasonic sensor has a thin-walled portion (semiconductor activated layer and insulating membrane layer) which is formed at a semiconductor substrate having a SOI (silicon on insulator) construction, and a piezoelectric oscillator where a strong dielectric is sandwiched between two electrodes (upper detection electrode and lower detection electrode). The piezoelectric oscillator is arranged to cover the thin-walled portion in such a manner that the electrodes are respectively arranged at the lower surface and the upper surface of the strong dielectric.

That is, the forming part of the thin-walled portion and the piezoelectric oscillator constructs a membrane structure where the semiconductor activated layer, the insulating membrane layer, the lower electrode, the strong dielectric and the upper electrode are sequentially stacked.

In the case where the piezoelectric-typed ultrasonic sensor is manufactured by the MEMS technology, a resonance frequency of a membrane structure which is constructed of the thin-walled portion and the piezoelectric oscillator may deviate from a desirable value due to unevenness in manufacture. Moreover, in the case of an ultrasonic sensor where the membrane structures are arrayed, there will be unevenness in the resonance frequencies of the membrane structures (that is, unevenness in sensitivities thereof).

Considering the above-described problem, it is proposed in JP-2003-284182A to adjust the resonance frequency of the ultrasonic sensor by applying a predetermined voltage between the two electrodes during the operation of the ultrasonic sensor. In this case, with the variation of a spontaneous polarization generated in the strong dielectric, the value of the physical property (for example, membrane stress and Young's modulus) related to the stiffness varies so that the resonance frequency varies. However, it is difficult to control the resonance frequency for a long time, because the state of the polarization gradually varies when the voltage is continuously applied.

Moreover, according to JP-2003-284182A, it is also proposed that the predetermined voltage is applied between the two electrodes before the operation of the ultrasonic sensor to beforehand change (polling) the spontaneous polarization of the strong dielectric so that the resonance frequency of the ultrasonic sensor is adjusted. However, in this case, the spontaneous polarization will become weak when being provided with ambient temperature, for example. Therefore, it is difficult to control the resonance frequency for a long time.

Furthermore, according to the methods in JP-2003-284182A, it is difficult to adjust if the material does not have the spontaneous polarization such as the strong dielectric. For example, the methods cannot be suitably used for a piezoelectric material such as aluminum nitride (AlN), zinc oxide (ZnO) or the like.

Moreover, according to the ultrasonic sensor having the membrane structure disclosed in JP-2003-284182A, buckling will be caused when the internal stress (in the state where piezoelectric oscillator does not vibrate) of the whole of the membrane structure constructed of the thin-walled portion and the piezoelectric oscillator is a compressive stress. Because the shape of the membrane structure in the state where the piezoelectric oscillator does not vibrate varies (i.e., is lack of reproducibility) due to buckling, there will also occur a variation in the deformation amount of the membrane structure when ultrasonic wave is received or sent. That is, there will have a variation in the sensitivity of the ultrasonic sensor.

Generally, for the ultrasonic sensor having the membrane structure, the internal stress (in the state where piezoelectric oscillator does not vibrate) of the whole of the membrane structure is adjusted to be a tensile stress or to be zero. Thus, the membrane structure in the state where the piezoelectric oscillator does not vibrate is maintained to be substantially flat, to reduce the variation in the deformation amount of the membrane structure when the ultrasonic wave is received or sent. However, because the internal stress of the whole of the membrane structure is adjusted to be the tensile stress or to be zero, the deformation amount of the membrane structure when the ultrasonic wave is received or sent will be small. That is, the sensitivity of the ultrasonic sensor will be low.

SUMMARY OF THE INVENTION

In view of the above-described disadvantage, it is a first object of the present invention to provide an ultrasonic sensor where a resonance frequency can be controlled for a long time, and a manufacture method thereof.

It is a second object of the present invention to provide an ultrasonic sensor having an improved sensitivity and a decreased unevenness in the sensitivity, and a manufacture method thereof.

According to a first aspect of the present invention, the ultrasonic sensor has a substrate unit including a thin-walled portion which is arranged at a part thereof and has a smaller thickness than other part thereof, a piezoelectric oscillator which includes two detection electrodes and a piezoelectric film positioned between the detection electrodes in a thickness direction of the substrate unit, and an adjustment electrode unit for applying a predetermined voltage to the thin-walled portion. The piezoelectric oscillator and the thin-walled portion construct a membrane structure. The adjustment electrode unit is spaced from the piezoelectric film. The predetermined voltage is applied to the thin-walled portion to cause a negative electrostatic spring effect for the membrane structure.

In this case, the predetermined voltage can be applied to the thin-walled portion of the membrane structure, to generate therebetween an electrostatic force. Thus, the membrane structure can be deformed (displaced). That is, the spring constant of the membrane structure can be substantially changed (that is called negative electrostatic spring effect), so that the resonance frequency can be adjusted. Moreover, because the predetermined voltage is not applied to the piezoelectric film of the piezoelectric oscillator (that is, voluntary polarization of piezoelectric film is not used), the resonance frequency can be controlled for a long time.

According to a second aspect of the present invention, the manufacture method is provided for the ultrasonic sensor having a piezoelectric oscillator in which a piezoelectric film is arranged between two detection electrodes in a thickness direction of a substrate unit and which is arranged at a thin-walled portion formed at the substrate unit. The manufacture method includes a first adjustment electrode manufacture process, an oscillator manufacture process, an etching process and a spacing process. In the first adjustment electrode manufacture process, a diffusion field of a P-typed conductivity is formed as a first adjustment electrode at a surface layer of a first silicon substrate of a N-typed conductivity which constructs the substrate unit. The surface layer is at a side of the piezoelectric oscillator. The first adjustment electrode is provided for applying a predetermined voltage to the thin-walled portion. In the oscillator manufacture process, one of the two detection electrodes, the piezoelectric film and the other of the two detection electrodes are sequentially stacked through insulating membranes at a part of the substrate unit where the thin-walled portion is arranged so that the piezoelectric oscillator is formed. The one of the two detection electrodes is positioned at a side of the substrate unit of the piezoelectric film. The other of the two detection electrodes is positioned at an opposite side of the piezoelectric film to the substrate unit. The oscillator manufacture process is performed after the first adjustment electrode manufacture process. In the etching process, an etching operation by a strong alkaline solution is performed from a side of one of surfaces of the first silicon substrate to remove a part of the first silicon substrate which is positioned corresponding to a forming field of the thin-walled portion in such a manner that the first adjustment electrode is remained. The one of the surfaces of the first silicon substrate is at an opposite side to the piezoelectric oscillator. In the spacing process, at least a part of the insulating membrane which contacts a surface of the first silicon substrate in the forming field of the thin-walled portion is removed to space the membrane structure and the first adjustment electrode from each other.

Thus, the part of the first silicon substrate which corresponds to the forming field of the thin-walled portion can be removed by the strong alkaline solution, in such a manner that the first adjustment electrode of a P-typed conductivity can be selectively remained. Therefore, the first adjustment electrode and the thin-walled portion can be efficiently formed.

According to a third aspect of the present invention, the ultrasonic sensor has a substrate unit including a thin-walled portion which is arranged at a part thereof and has a smaller thickness than other part thereof, and a piezoelectric oscillator which includes two electrodes and a piezoelectric film positioned between the two electrodes. The piezoelectric oscillator is arranged at the thin-walled portion. The thin-walled portion and the piezoelectric oscillator construct a membrane structure which has a predetermined resonance frequency. The membrane structure is adjusted so that an internal stress of the membrane structure when the piezoelectric oscillator does not vibrate is a tensile stress or substantial zero on the whole. The thin-walled portion includes a concave portion, which is arranged at a part of the thin-walled portion and has a smaller thickness than other part thereof.

Because the internal stress of the membrane structure when the piezoelectric oscillator does not vibrate is the tensile stress or substantial zero on the whole, the membrane structure can be maintained to have a substantially flat shape when the piezoelectric oscillator does not vibrate. That is, buckling can be restricted. Therefore, the variation in the sensitivity of the ultrasonic sensor can be reduced. That is, the variation in the deformation amount of the membrane structure when the ultrasound is received (or sent) can be restricted.

Moreover, because the thin-walled portion includes the concave portion which is arranged at the part of the thin-walled portion and has the smaller thickness than the other part thereof, the internal stress of the whole membrane structure is substantially same. Thus, the deformation amount of the membrane structure when the ultrasound is received (or sent) can be increased, as compared with the structure where the thickness of the thin-walled portion is even. Therefore, the sensitivity of the ultrasonic sensor can be improved.

According to a fourth aspect of the present invention, the ultrasonic sensor has a substrate unit including a thin-walled portion which is arranged at a part thereof and has a smaller thickness than other part thereof, and a piezoelectric oscillator which includes two electrodes and a piezoelectric film positioned between the two electrodes, the piezoelectric oscillator being arranged at the thin-walled portion. The thin-walled portion and the piezoelectric oscillator construct a membrane structure which has a predetermined resonance frequency. An internal stress of the membrane structure in a state where the piezoelectric oscillator does not vibrate is a tensile stress or substantial zero on the whole. The membrane structure has a compressive stress region, in which an internal stress is a compressive stress in a surface direction of the substrate unit when the piezoelectric oscillator does not vibrate.

Because the internal stress of the membrane structure when the piezoelectric oscillator does not vibrate is the tensile stress or substantial zero on the whole, the membrane structure can be maintained to have a substantially flat shape when the piezoelectric oscillator does not vibrate. That is, buckling can be restricted. Therefore, the variation in the sensitivity of the ultrasonic sensor can be reduced. That is, the variation in the deformation amount of the membrane structure when the ultrasound is received (or sent) can be restricted.

Moreover, because the membrane structure has the compressive stress region in which the internal stress is the compressive stress in the surface direction of the substrate unit when the piezoelectric oscillator does not vibrate, the deformation amount of the membrane structure when the ultrasound is received (or sent) can be increased, as compared with the structure where the internal stress in the whole membrane structure is the tensile stress or substantial zero. Therefore, the sensitivity of the ultrasonic sensor can be improved.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE EXAMPLED EMBODIMENTS

First Embodiment

Figure 1:
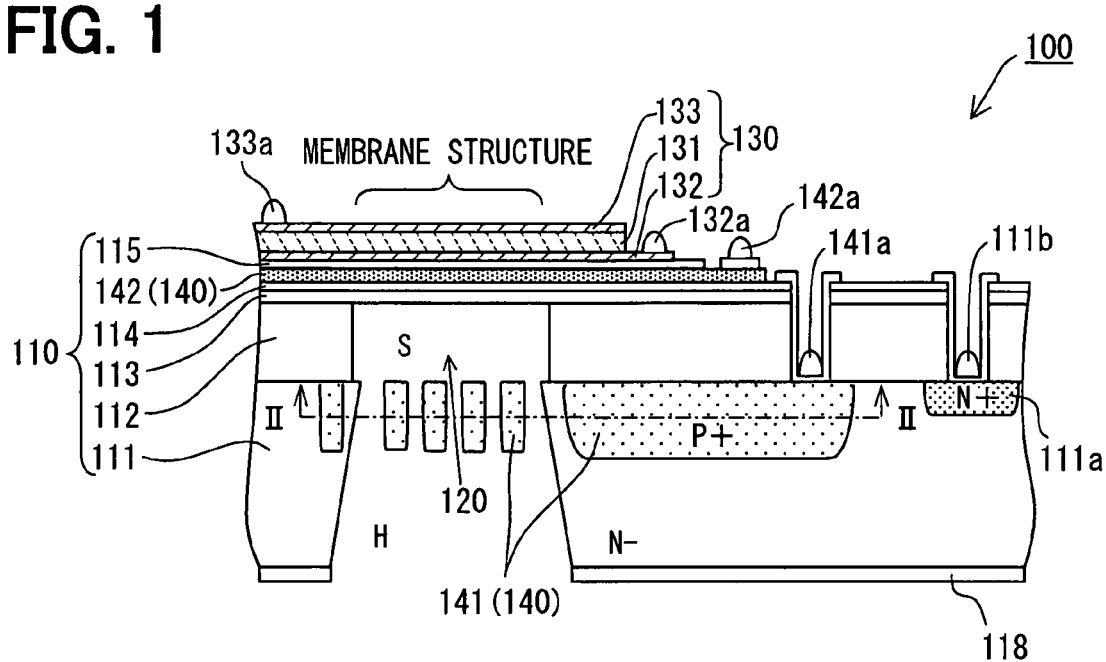
FIG. 1 is a partially sectional view showing an ultrasonic sensor according to a first embodiment of the present disclosure.

An ultrasonic sensor 100 according to a first embodiment of the present invention will be described with reference to FIGS. 1-5B. As shown in FIG. 1, the ultrasonic sensor 100 can be a piezoelectric type ultrasonic sensor which is manufactured by MEMS technology, for example.

The ultrasonic sensor 100 has a substrate unit 110, a piezoelectric oscillator 130 which is arranged at a thin-walled portion 120 of the substrate unit 110, and an adjustment electrode unit 140 for applying a predetermined voltage to the thin-walled portion 120. In this case, the adjustment electrode unit 140 includes a first adjustment electrode 141 and a second adjustment electrode 142.

The substrate unit 110 includes a semiconductor substrate 111 (semiconductor-on-insulator substrate) of a first conductivity type. In this embodiment, the semiconductor substrate 111 is constructed of a N-typed silicon substrate of a (100) plane orientation. The first adjustment electrode 141 as a diffusion field of a P-typed conductivity is arranged at a surface layer (of the side of piezoelectric oscillator 130) of the semiconductor substrate 111.

The semiconductor substrate 111 has a through hole H which is positioned corresponding to the thin-walled portion 120. A part of the first adjustment electrode 141 is exposed to the inside of the through hole H. The thin-walled portion 120 and the piezoelectric oscillator 130 construct a membrane structure. In this case, the first adjustment electrode 141 is arranged at a part of the forming field of the membrane structure in the surface direction of the substrate unit 110, in such a manner that the first adjustment electrode 141 does not completely block the through hole H.

Figure 2:
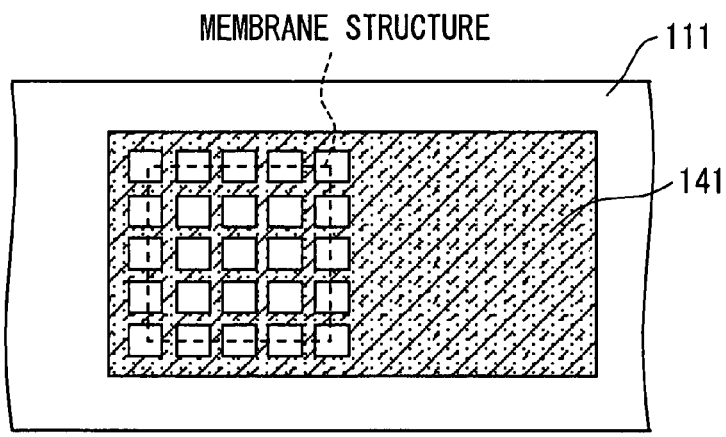
FIG. 2 is a partially sectional view taken along a line II-II in FIG. 1.

Specifically, as shown in FIG. 2, in the forming field (i.e. field which is surrounded by broken line in FIG. 2) of the membrane structure, the first adjustment electrode 141 is provided with a lattice shape.

As shown in FIG. 1, a N+ diffusion field 111*a* is formed at the surface layer (of the side of piezoelectric oscillator 130) of the semiconductor substrate 111 and positioned at the portion where the first adjustment electrode 141 is not arranged. Thus, the potential of a pad 111*b* of the N+ diffusion field 111*a* can be set higher (by a predetermined value, for example) than that of a pad 141*a* of the first adjustment electrode 141. The semiconductor substrate 111 and the first adjustment electrode 141 are insulated from each other by a PN joining.

Moreover, in addition to the semiconductor substrate 111, the substrate unit 110 further includes multiple layers of insulating membranes 112-115 which are stacked at the semiconductor substrate 111 and the second adjustment electrode 142 which is sandwiched between the insulating membranes.

Specifically, in this embodiment, as shown in FIG. 1, the first oxidation membrane 112 which can be constructed of a silicon oxidation membrane, the nitride membrane 113 which can be constructed of a silicon nitride membrane, the second oxidation membrane 114 which can be constructed of a silicon oxidation membrane, and the third oxidation membrane 115 which can be constructed of a silicon oxidation membrane are sequentially stacked from the surface (of the side of piezoelectric oscillator 130) of the semiconductor substrate 111.

The second adjustment electrode 142 can be constructed of a polycrystalline silicon membrane (i.e., polysilicon) where dopant impurity (e.g., boron or phosphorus) is introduced, and sandwiched between the second oxidation membrane 114 and the third oxidation membrane 115. In this embodiment, boron can be provided for the polycrystalline silicon membrane, and have an adjusted concentration therein.

The first oxidation membrane 112 can function as an etching stopper when the through hole H is formed at the semiconductor substrate 111. The part of the first oxidation membrane 112 which corresponds to the thin-walled portion 120 (membrane structure) is removed, so that a space S is provided at the removed portion.

Thus, the thin-walled portion 120 is constructed of parts of the above-described insulating membranes 113-115 (stacked at first oxidation membrane 112) and the second adjustment electrode 142. These parts are positioned at the upper side of the space S.

That is, the space S is positioned between the lower surface (at the side of nitride membrane 113) of the thin-walled portion 120 and the first adjustment electrode 141, which are spaced from each other at least in the state where the piezoelectric oscillator 130 does not vibrate.

The nitride membrane 113 functions as the etching stopper when the space S is formed at the first oxidation membrane 112. Furthermore, the nitride membrane 113 functions to restrict the membrane structure (thin-walled member 120) from buckling in the state where the piezoelectric oscillator 130 does not vibrates, by using that the membrane stress itself is tensile.

Figure 3:
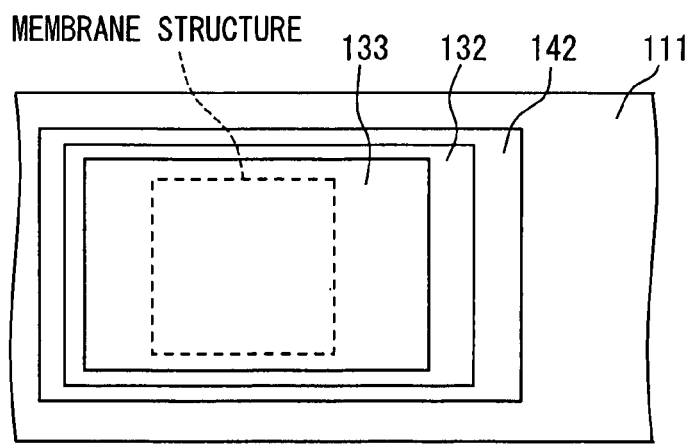
FIG. 3 is a plan view showing the ultrasonic sensor when being viewed from a side of a piezoelectric oscillator according to the first embodiment.

The piezoelectric film 131 of the piezoelectric oscillator 130 is arranged between a lower detection electrode 132 and an upper detection electrode 133. In this embodiment, as shown in FIG. 3, the lower detection electrode 132, the piezoelectric film 131 and the upper detection electrode 133 are sequentially stacked at the upper side (which is opposite to the side of nitride membrane 113) of the third oxidation membrane 115, to cover the forming field (i.e., field surround by broken line in FIG. 3) of the membrane structure.

The piezoelectric film 131 can be made of PZT which is a strong dielectric, or aluminum nitride (AlN), or zinc oxide (ZnO) or the like. The detection electrode 132, 133 can be made of platinum (Pt), or gold (Au), or aluminum (Al), or the like. In this embodiment, the piezoelectric film 131 is made of PZT. The detection electrode 132, 133 is made of Pt. A pad 132a, a pad 133a, a pad 142a, and a silicon nitride membrane 118 which constructs a mask when the through hole H is formed, are shown in FIG. 1.

According to this embodiment, the ultrasonic sensor 100 is provided with the membrane structure which is constructed of the thin-walled portion 120 and the piezoelectric oscillator 130. The thin-walled portion 120 is thinner than the other portion of the substrate unit 110. The membrane structure is deformable when an exterior force such as ultrasound is applied thereto.

Generally, in a piezoelectric type ultrasonic sensor manufactured by MEMS technology, a resonance frequency of a membrane structure constructed of a thin-walled portion and a piezoelectric oscillator may deviate from a desirable value due to manufacture unevenness. Moreover, in an ultrasonic sensor where multiple membrane structures are arrayed, there will be unevenness in resonance frequencies of the membrane structures (that is, unevenness in sensor sensitivities).

According to the ultrasonic sensor 100 of the first embodiment, a predetermined voltage can be applied between the second adjustment electrode 142 of the thin-walled portion 120 and the first adjustment electrode 141 which is spaced from the thin-walled portion 120 through the space S. That is, the predetermined voltage can be applied to the thin-walled portion 120 of the membrane structure.

In this case, the predetermined voltage is applied between the first adjustment electrode 141 and the second adjustment electrode 142, to generate therebetween an electrostatic force (electrostatic attractive force) which has a contrary direction to an elastic restoring force of the membrane structure when the ultrasound is received. Thus, the membrane structure can be deformed (displaced).

In this case, the electrostatic force which is applied in the thickness direction of the substrate unit 110 will increase inversely proportionally to the square of a distance between the first adjustment electrode 141 and the second adjustment electrode 142, and proportionally to the square of the applied voltage. Therefore, when the applied voltage becomes high and the distance becomes small, the net elastic restoring force will become small so that the resonance frequency shifts to the side of the low frequency.

In this case, the first adjustment electrode 141 and the second adjustment electrode 142 are not directly arranged at the piezoelectric film 131. That is, the first adjustment electrode 141 and the second adjustment electrode 142 do not contact with the piezoelectric film 131. According to this embodiment, the space S is arranged between the first adjustment electrode 141 and the membrane structure including the piezoelectric film 131, and the third oxidation membrane 115 is arranged between the second adjustment electrode 142 and the piezoelectric oscillator 130 (including piezoelectric film 131).

According to this embodiment, the predetermined voltage is applied to the thin-walled portion 120 of the membrane structure via the first adjustment electrode 141 and the second adjustment electrode 142, so that the spring constant (stiffness) of the membrane structure can be changed. That is, the spring constant of the membrane structure can be substantially changed (that is called negative electrostatic spring effect), so that the resonance frequency can be adjusted to have the desirable value.

Moreover, the predetermined voltage applied between the first adjustment electrode 141 and the second adjustment electrode 142 can be adjusted so that the output of the ultrasonic sensor 100 becomes substantially maximum when the ultrasound having a predetermined frequency is received.

In this embodiment, the first adjustment electrode 141 is spaced from the thin-walled portion 120 (membrane structure), and the thickness of the first adjustment electrode 141 is set larger than the thickness of the membrane structure. Thus, when the electrostatic force (electrostatic attractive force) is generated between the first adjustment electrode 141 and the second adjustment electrode 142, the first adjustment electrode 141 is not displaced and the membrane structure including the second adjustment electrode 142 is deformed (displaced). Because the displacement of the first adjustment electrode 141 is restricted and the membrane structure including the second adjustment electrode 142 is deformed, the deformation amount of the membrane structure can be increased. That is, the resonance frequency can be adjusted efficiently.

Moreover, according to this embodiment, because the predetermined voltage is not applied to the piezoelectric film 131 of the piezoelectric oscillator 130 (that is, voluntary polarization of piezoelectric film 131 is not used), the resonance frequency can be controlled for a long time.

Next, a manufacture method of the ultrasonic sensor 100 will be described.

Figure 4A:
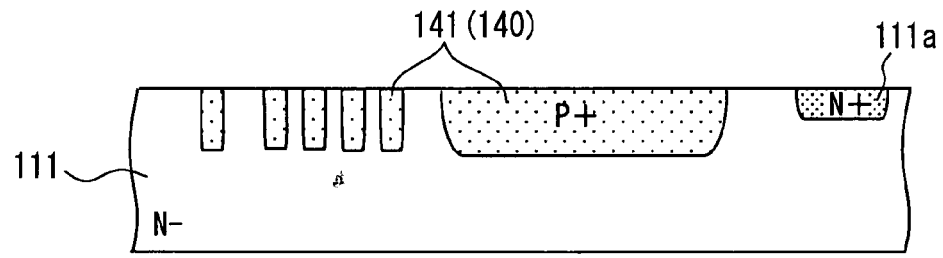
FIGS. 4A-4C are partially sectional views which respectively show a first adjustment electrode manufacture process, a second adjustment electrode manufacture process and an oscillator manufacture process of a manufacture method of the ultrasonic sensor according to the first embodiment.
Figure 4B:
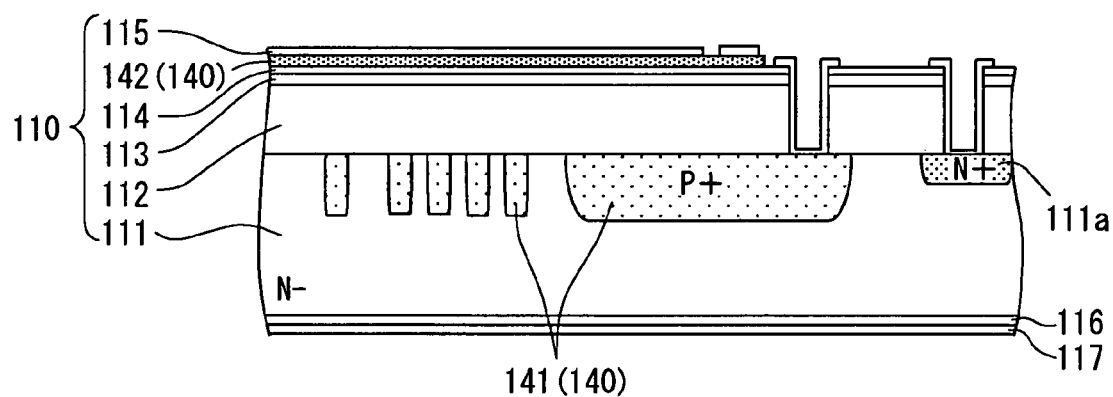
Figure 4C:
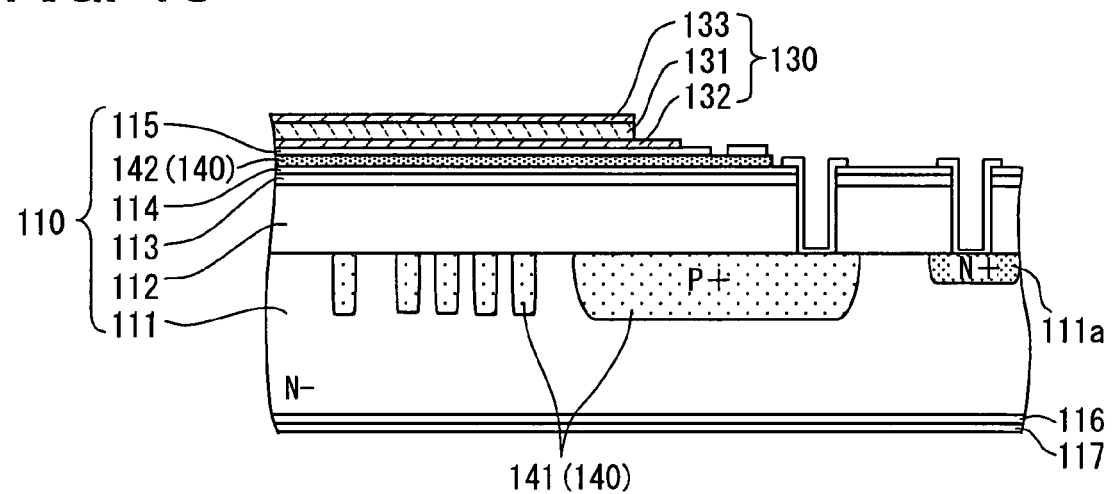
Figure 5A:
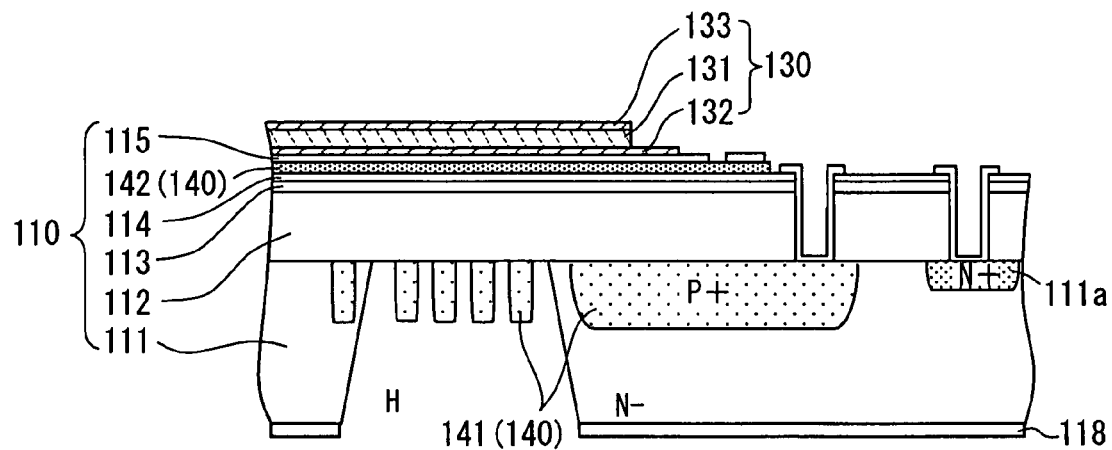
FIGS. 5A-5B are partially sectional views which respectively show an etching process and a spacing process of the manufacture method of the ultrasonic sensor according to the first embodiment.
Figure 5B:
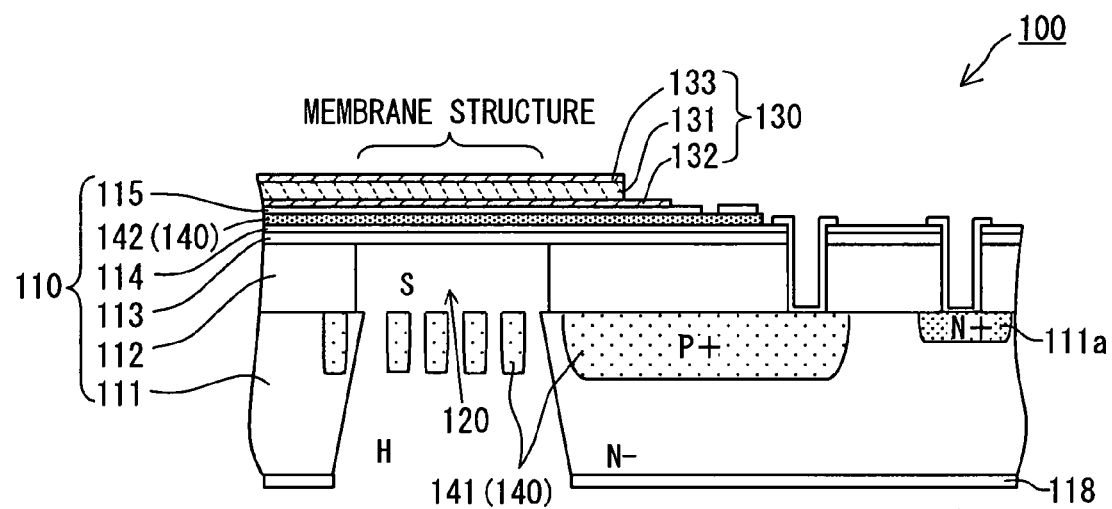

FIGS. 4A-4C respectively show a first adjustment electrode manufacture process, a second adjustment electrode manufacture process, and an oscillator manufacture process according to the manufacture method. FIGS. 5A and 5B respectively show an etching process and a spacing process according to the manufacture method.

At first, the first adjustment electrode manufacture process will be performed.

As shown in FIG. 4A, the N-typed silicon substrate of the (100) plane orientation is prepared as the semiconductor substrate 111, and the first adjustment electrode 141 of the adjustment electrode unit 140 is formed at the surface layer (at the arrangement side of piezoelectric oscillator 130) of the semiconductor substrate 111.

Specifically, a mask (not shown) which is constructed of a silicon oxidation membrane (having a thickness of 1 μm, for example) is formed at the surface (at the arrangement side of the piezoelectric oscillator 130) of the semiconductor substrate 111, and dopant impurity is ion-injected to a predetermined position. For example, in this embodiment, boron ion can be injected at a dose amount $8\times10^{16}/cm^2$. Then, a heat treatment (for example, for 10 h at 1150° C.) is performed. Thus, the first adjustment electrode 141 having the thickness (depth) of, for example, about 3 μm, can be formed.

Moreover, the dopant impurity is ion-injected (in this case, phosphorus ion is injected) to the surface (which is at the arrangement side of the piezoelectric oscillator 130 and at which first adjustment electrode 141 is not formed) of the semiconductor substrate 111, to form the N+ diffusion field 111a for taking out the potential of the semiconductor substrate 111. Alternatively, instead of the ion injection method, a diffusion method can be also used for the forming of the first adjustment electrode 141 and the N+ diffusion field 111a.

After the first adjustment electrode 141 is formed, the second adjustment electrode manufacture process will be performed. As shown in FIG. 4B, the second adjustment electrode 142 of the adjustment electrode unit 140 is formed at the surface of the semiconductor substrate 111 where the first adjustment electrode 141 is formed.

Specifically, the first oxidation membrane 112 made of the silicon oxidation membrane is formed at the surface of the semiconductor substrate 111. In this embodiment, the first oxidation membrane 112 having the thickness of about 4 μm is formed by plasma CVD method. Alternatively, the first oxidation membrane 112 can be also formed by heat oxidation.

After the first oxidation membrane 112 is formed, the nitride membrane 113 which can be made of the silicon nitride membrane is formed at the first oxidation membrane 112. In this embodiment, the nitride membrane 113 having the thickness of about 0.4 μm is formed by LP-CVD method. At this time, a nitride membrane 116 made of the silicon nitride membrane is formed at the back surface (which is at an opposite side of semiconductor substrate 111 to first oxidation membrane 112) of the semiconductor substrate 111. After the nitride membrane 113 is formed, the second oxidation membrane 114 made of the silicon oxidation membrane is formed at the nitride membrane 113. In this embodiment, the second oxidation membrane 114 having the thickness of about 0.2 μm can be formed by plasma CVD method.

After the second oxidation membrane 114 is formed, for example, the polysilicon membrane is stacked at the second oxidation membrane 114 and dopant impurity ion is injected.

In this embodiment, the boron ion is injected at a dose amount $2\times10^{16}/cm^2$. Thereafter, a heat treatment (for example, for 2 h at 1150° C.) is performed.

However, the dopant impurity injected to the polysilicon membrane is not limited to boron. For example, the dopant impurity can be phosphorus. Moreover, the forming method of the polysilicon membrane where the dopant impurity is introduced is not limited to what is described above. For example, a polysilicon membrane where the dopant impurity is doped can be also formed. Thus, after the second adjustment electrode 142 where the dopant impurity is introduced is formed, the third oxidation membrane 115 constructed of the silicon oxidation membrane is formed on the second adjustment electrode 142. In this embodiment, the third oxidation membrane 115 having the thickness of about 0.2 μm is formed by plasma CVD method. In this case, the polysilicon membrane 117 is formed at the back surface of the semiconductor substrate 111.

Then, the unwanted parts of the third oxidation membrane 115, the second adjustment electrode 142, the second oxidation membrane 114, the nitride membrane 113 and the first oxidation membrane 112 which are formed as described above are sequentially removed by, for example, a dry etching, and are respectively provided with patterning as shown in FIG. 4B. Thus, the second adjustment electrode 142 is provided with patterning, and the upper surface and the lower surface of the second adjustment electrode 142 are sandwiched between the third oxidation membrane 115 and the second oxidation membrane 114, so that the second adjustment electrode 142 covering the thin-walled portion 120 is formed.

After the second adjustment electrode 142 is formed, the piezoelectric oscillator manufacture process will be performed. As shown in FIG. 4C, the piezoelectric oscillator 130 is formed on the second adjustment electrode 142 in such a manner that the piezoelectric oscillator 130 covers the forming field of the thin-walled portion 120. Specifically, Pt membrane or the like is stacked at the third oxidation membrane 115 by evaporation method, and the unwanted part thereof is removed by dry etching, for example.

Thus, the detection electrode 132 which is provided with patterning to cover the thin-walled portion 120 is formed. In this embodiment, the detection electrode 132 having the thickness of about 0.25 μm is formed. After the detection electrode 132 is formed, a PZT membrane as the piezoelectric film 131 is formed at the detection electrode 132 by sputter method, CVD method, sol-gel method or the like in such a manner that the PZT membrane covers the thin-walled portion 120. Then, the unwanted part thereof is removed by dry etching, for example. In this embodiment, the piezoelectric film 131 having the thickness of about 1.0 μm is formed by the sputter method.

After the piezoelectric film 131 is formed, Pt membrane is stacked at the piezoelectric film 131 by evaporation method, and the unwanted part thereof is removed by dry etching, for example. Thus, the detection electrode 133 which is provided with the patterning to cover the thin-walled portion 120 is formed. In this embodiment, the detection electrode 133 having the thickness of about 0.25 μm is formed.

After the piezoelectric oscillator 130 is formed, the etching process will be performed. As shown in FIG. 5A, the back surface of the semiconductor substrate 111 is ground/polished, and the nitride membrane 116 and the polysilicon membrane 117 are removed.

Thereafter, the silicon nitride membrane 118 is formed at the back surface of the substrate unit 111 by the plasma CVD method, and the unwanted part of the silicon nitride membrane 118 which corresponds to the forming portion of the thin-walled portion 120 is removed by dry etching, for example.

In this embodiment, the silicon nitride membrane 118 having the thickness of about 0.5 µm is formed, to construct a mask when etching is performed. After the mask is formed, the side of the back surface of the semiconductor substrate 111 is dipped in a strong alkaline solution such as TMAH, KOH or the like, and the semiconductor substrate 111 is anisotropically etched with the first oxidation membrane 112 being used as an etching stopper. Thus, the through hole H is formed at the semiconductor substrate 111. In this case, though the semiconductor substrate 111 of the N-typed conductivity is anisotropically etched by strong alkaline solution, the first adjustment electrode 141 of the P-typed conductivity is not etched to be remained in the through hole H.

The part of the first adjustment electrode 141 which is in the through hole H (that is, in forming field of membrane structure) has a lattice shape. Thus, after the through hole H is formed, the part of the first oxidation membrane 112 which corresponds to the thin-walled portion 120 (membrane structure) is removed through the first adjustment electrode 141 having the lattice shape.

Specifically, the back surface side of the semiconductor substrate 111 is dipped in, for example, hydrofluoric acid liquid, so that the part of the first oxidation membrane 112 which corresponds to the thin-walled portion 120 is removed. Thus, the space S is provided, and the thin-walled portion 120 is formed at the substrate unit 110. That is, the membrane structure which is constructed of the thin-walled portion 120 and the piezoelectric oscillator 130 is formed. Moreover, the thin-walled portion 120 and the first adjustment electrode 141 are spaced from each other. What is described above is the spacing process.

According to the manufacture method described in this embodiment, the ultrasonic sensor 100 (with reference to FIG. 1) where the predetermined voltage is applied between the first adjustment electrode 141 and the second adjustment electrode 142 can be manufactured.

Moreover, the part of the semiconductor substrate 111 which corresponds to the forming field of the thin-walled portion 120 can be removed by the strong alkaline solution, and the first adjustment electrode 141 of the P-typed conductivity can be selectively remained. Therefore, the first adjustment electrode 141 and the thin-walled portion 120 can be formed effectively.

Figure 6:
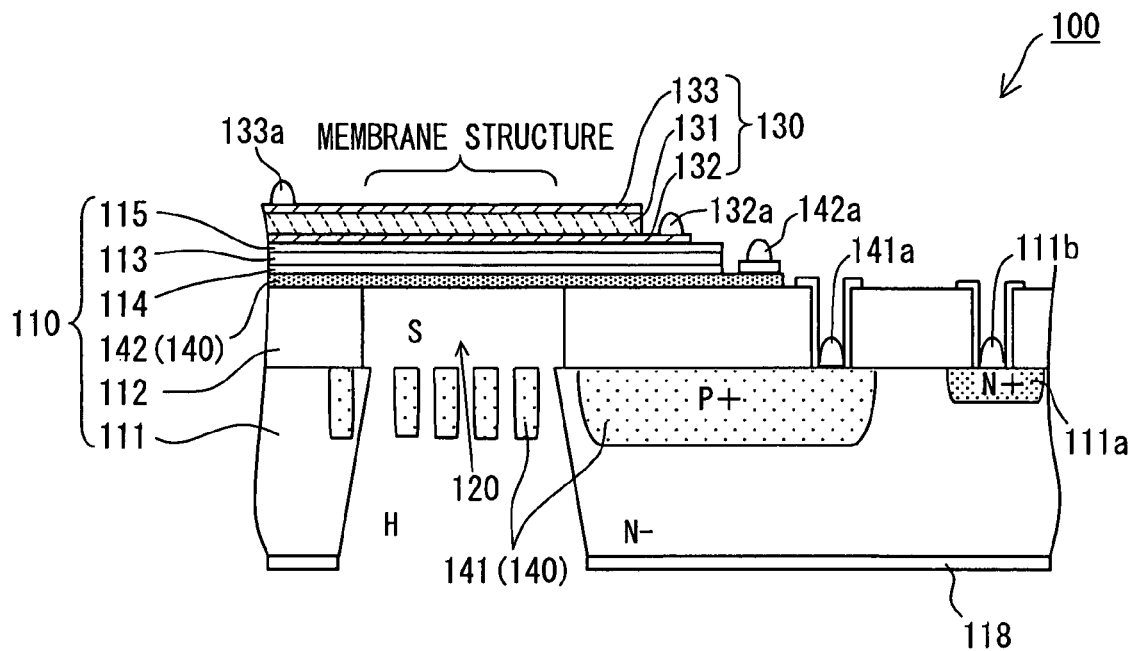
FIG. 6 is a partially sectional view showing an ultrasonic sensor according to a modification of the first embodiment of the present disclosure.

However, the ultrasonic sensor 100 where the predetermined voltage is applied between the first adjustment electrode 141 and the second adjustment electrode 142 is not limited to what is described above. For example, according to a modification of the first embodiment with reference to FIG. 6, the stacking sequence of the second adjustment electrode 142 and the nitride membrane 113 can be also interchanged as compared with the case shown in FIG. 1. In this case, because the distance between the first adjustment electrode 141 and the second adjustment electrode 142 becomes short, the resonance frequency of the membrane structure can be adjusted at a lower voltage than that in the case shown in FIG. 1.

Moreover, the predetermined voltage can be also applied between the first adjustment electrode 141 and the detection electrode 132 which is positioned at a side of the substrate unit 110.

Second Embodiment

Next, a second embodiment of the present invention will be described with reference to FIGS. 7-9B.

Figure 7:
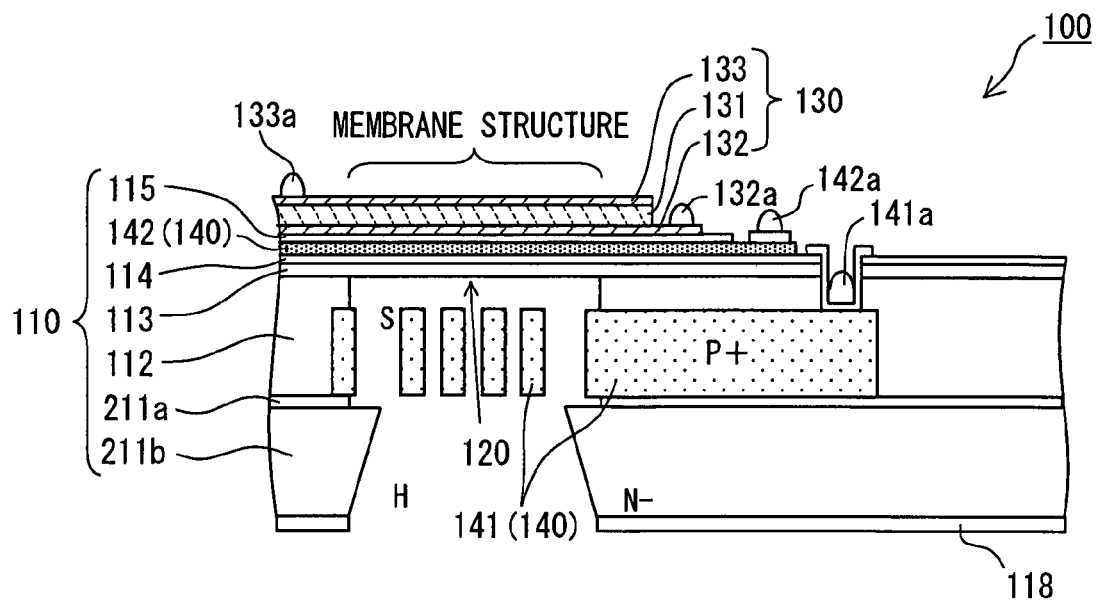
FIG. 7 is a partially sectional view showing an ultrasonic sensor according to a second embodiment of the present disclosure.

As shown in FIG. 7, the ultrasonic sensor 100 can be constructed of the ultrasonic sensor of the piezoelectric type which is manufactured by the MEMS technology. The ultrasonic sensor 100 includes the substrate unit 110, the piezoelectric oscillator 130 formed at the thin-walled portion 120 of the substrate unit 110 and the adjustment electrode unit 140 for applying the predetermined voltage to the thin-walled portion 120. The adjustment electrode unit 140 has the first adjustment electrode 141 and the second adjustment electrode 142.

The substrate unit 110 has the semiconductor substrate 111 where a semiconductor layer 211c is arranged at a support substrate 211b through an embedded insulating membrane 211a (silicon oxidation membrane). Dopant impurity (e.g., boron which is used in this embodiment) is introduced into the semiconductor layer 211c, and the semiconductor layer 211c is provided with patterning to have a predetermined shape. Thus, the first adjustment electrode 141 shown in FIG. 7 is constructed. Moreover, the through hole H is formed at the support substrate 211b at a position corresponding to that of the thin-walled portion 120.

The substrate unit 110 has the semiconductor substrate 111, the multiple layers of insulating membranes 112-115 which are stacked at the semiconductor substrate 111, and the second adjustment electrode 142 which is sandwiched between the insulating membranes. According to the second embodiment, the first oxidation membrane 112 which is constructed of the silicon oxidation membrane is arranged at the embedded insulating film 211a and the first adjustment electrode 141.

Thus, according to the second embodiment, the parts of the embedded insulating film 211a and the first oxidation membrane 112 which correspond to the thin-walled portion 120 (membrane structure) are respectively removed, so that the space S is formed at the removed portion.

Therefore, the thin-walled portion 120 is constructed of parts of the nitride membrane 113 which is stacked at the first oxidation membrane 112, the second oxidation membrane 114 constructed of the silicon oxidation membrane, the third oxidation membrane 115 constructed of the silicon oxidation membrane, and the second adjustment electrode 142. These parts are positioned at the upper side of the space S.

That is, the space S is arranged between the lower surface (nitride membrane 113) of the thin-walled portion 120 and the first adjustment electrode 141, which are spaced from each other at least in the state where the piezoelectric oscillator 130 does not vibrate.

About the ultrasonic sensor 100, what has not been described in the second embodiment is the same with the first embodiment.

According to the second embodiment, the predetermined voltage can be applied between the second adjustment electrode 142 (which constructs a part of thin-walled portion 120) and the first adjustment electrode 141 which is spaced from the thin-walled portion 120 through the space S. That is, the predetermined voltage can be applied to the thin-walled portion 120 of the membrane structure. Thus, the membrane structure can be deformed (displaced), because the predetermined voltage is applied between the first adjustment electrode 141 and the second adjustment electrode 142 to generate therebetween the electrostatic force (electrostatic attractive force) which has the contrary direction to the elastic restoring force of the membrane structure when the ultrasound is received. Therefore, the resonance frequency of the membrane structure can be adjusted to have the desirable value, by substantially changing the spring constant of the membrane structure by the negative electrostatic spring effect.

In this embodiment, the first adjustment electrode 141 is spaced from the thin-walled portion 120 (of membrane structure), and the thickness of the first adjustment electrode 141 is set larger than the thickness of the membrane structure. Thus, the displacement of the first adjustment electrode 141 can be restricted, and the membrane structure including the second adjustment electrode 142 can be deformed. Therefore, the deformation amount of the membrane structure can be much increased. That is, the resonance frequency of the membrane structure can be adjusted efficiently.

Moreover, according to this embodiment, because the predetermined voltage is not applied to the piezoelectric film 131 of the piezoelectric oscillator 130 (that is, voluntary polarization of piezoelectric film 131 is not used), the resonance frequency can be controlled for a long time.

Figure 8A:
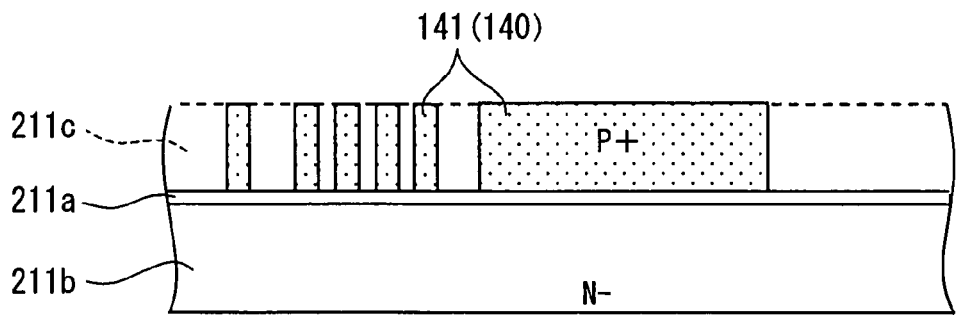
FIGS. 8A-8C are partially sectional views which respectively show a first adjustment electrode manufacture process, a second adjustment electrode manufacture process and an oscillator manufacture process of a manufacture method of the ultrasonic sensor according to the second embodiment.
Figure 8B:
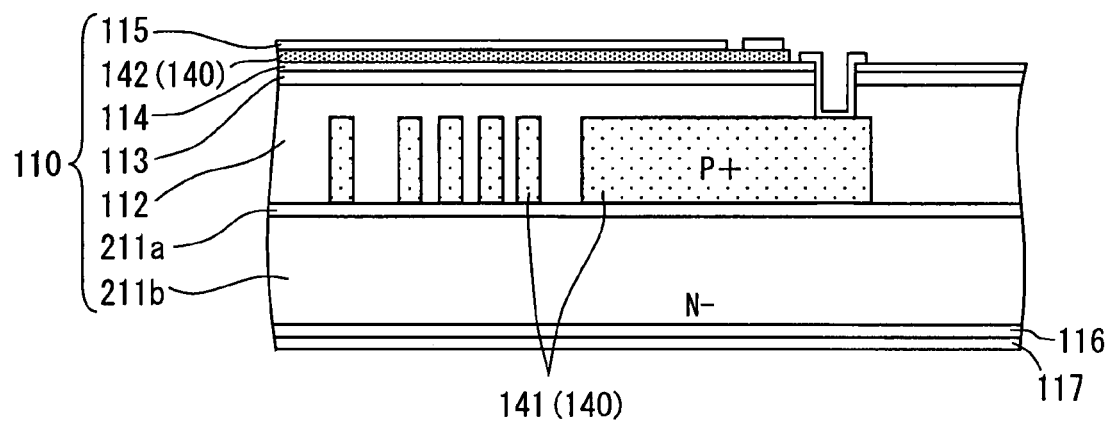
Figure 8C:
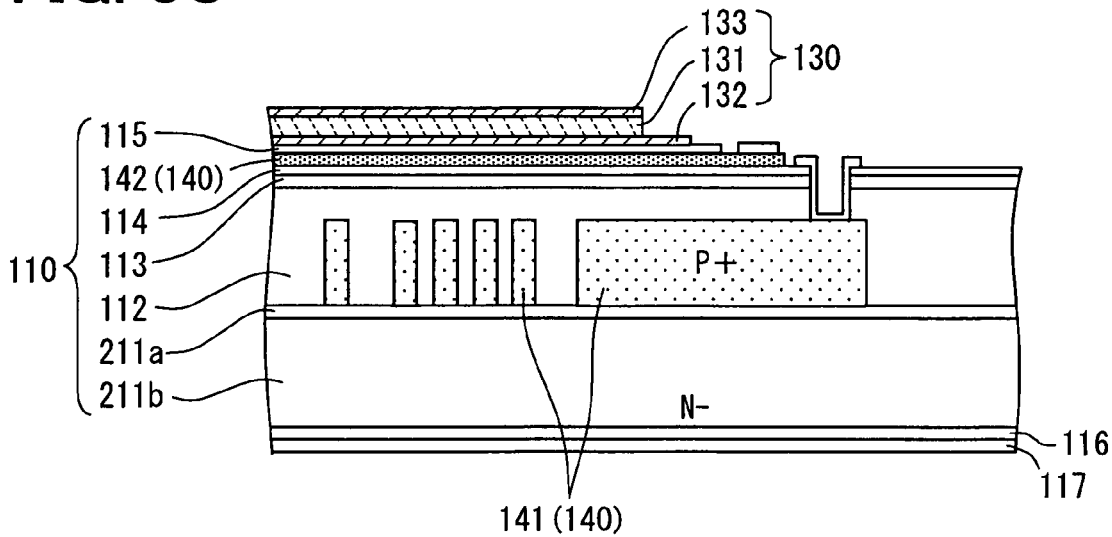
Figure 9A:
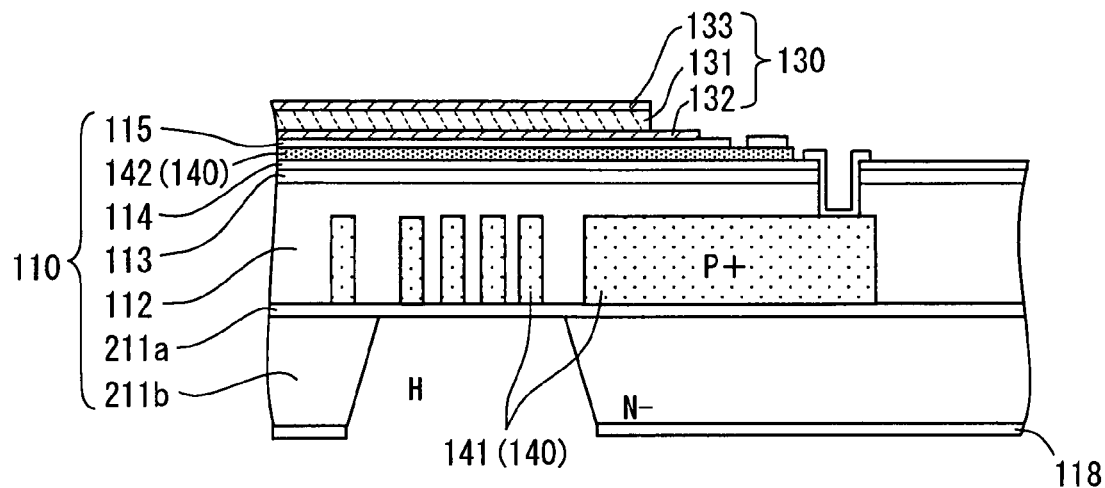
FIGS. 9A-9B are partially sectional views which respectively show an etching process and a spacing process of the manufacture method of the ultrasonic sensor according to the second embodiment.
Figure 9B:
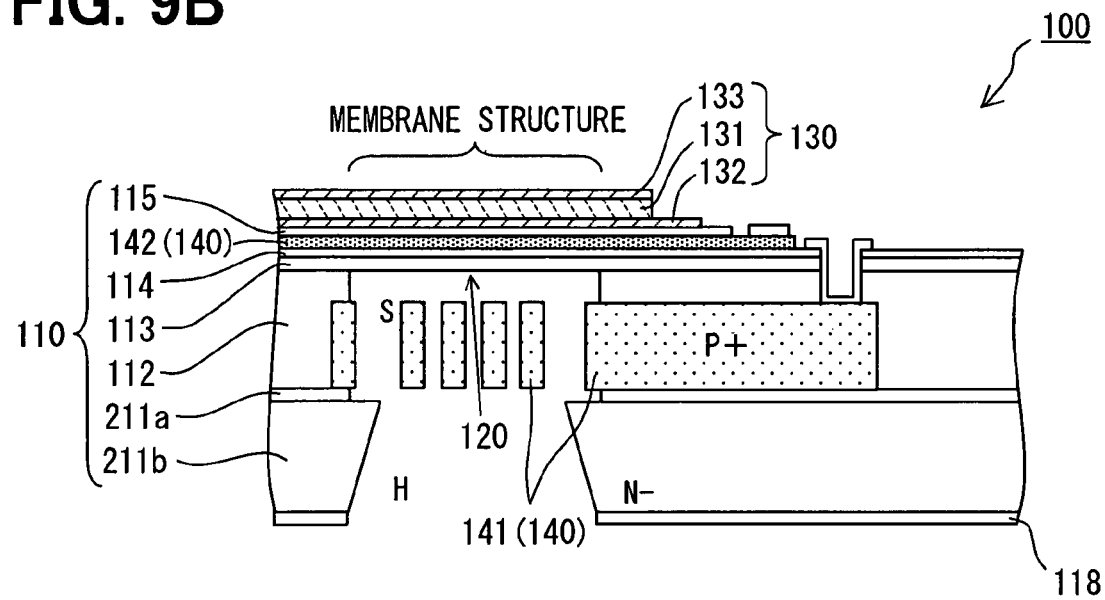

Next, the manufacture method of the ultrasonic sensor 100 according to this embodiment will be described. FIGS. 8A-8C respectively show the first adjustment electrode manufacture process, the second adjustment electrode manufacture process and the oscillator manufacture process of the manufacture method. FIGS. 9A and 9B respectively show the etching process and the spacing process of the manufacture method.

At first, as shown in FIG. 8A, the semiconductor substrate 111 (SOI substrate) where the semiconductor layer 211c is arranged at the support substrate 211b of the semiconductor substrate 111 through the embedded insulating membrane 211a constructed of the silicon oxidation membrane, is prepared. In the second embodiment, the semiconductor layer 211c can be provided with the thickness of about 3.5 µm, and the embedded insulating membrane 211a can be provided with the thickness of about 0.5 µm.

Thus, the dopant impurity is ion-injected into the semiconductor layer 211c (in this embodiment, boron ion is injected at a dose amount $8 \times 10^{16}/cm^2$), and a heat treatment (for example, for 10 h at 1150° C.) is performed. Then, the semiconductor layer 211c is provided with patterning to have a predetermined shape. Thus, the first adjustment electrode 141 is formed.

According to the second embodiment, the first adjustment electrode 141 has the substantially same construction with that described in the first embodiment. That is, the first adjustment electrode 141 has the substantially lattice shape in the forming field of the membrane structure. However, the dopant impurity is not limited to boron. For example, the dopant impurity can be phosphorus or the like. What is described above is the first adjustment manufacture process.

After the first adjustment electrode 141 is formed, the second adjustment electrode 142 will be formed. As shown in FIG. 8B, the first oxidation membrane 112 made of the silicon oxidation membrane is formed at the surface of the embedded insulating membrane 211a and the first adjustment electrode 141. In this embodiment, the silicon oxidation membrane can be formed by plasma CVD method, and provided with a smoothing process through etchback, to construct the first oxidation membrane 112 having the thickness of about 5 µm. Alternatively, the smoothing process can be also omitted.

After the first oxidation membrane 112 is formed, the nitride membrane 113, the second oxidation membrane 114, the second adjustment electrode 142 and the third oxidation membrane 115 are stacked and formed with the substantially same method and construction as the first embodiment. What is described above is the second adjustment manufacture process. As shown in FIG. 8B, the nitride membrane 116 is formed at the back surface (with respect to arrangement surface of embedded insulating membrane 211a) of the support substrate 211b, along with the forming of the nitride membrane 113. The silicon membrane 117 is formed along with the forming of the second adjustment electrode 142.

After the second adjustment electrode 142 is formed, as shown in FIG. 8C, the piezoelectric oscillator 130 will be formed at the second adjustment electrode 142 in such a manner that the piezoelectric oscillator 130 covers the forming field of the thin-walled portion 120, by the substantially same manufacture method and construction as the first embodiment.

After the piezoelectric oscillator 130 is formed, as shown in FIG. 9A, the back surface of the support substrate 211b is ground/polished, and the nitride membrane 116 and the silicon membrane 117 are removed. Thereafter, the silicon nitride membrane 118 is formed at the back surface of the support substrate 211b by the plasma CVD method, and the unwanted part of the silicon nitride membrane 118 which corresponds to the forming portion of the thin-walled portion 120 is removed by dry etching, for example.

In this embodiment, the silicon nitride membrane 118 having the thickness of about 0.5 µm is formed, to construct a mask at etching. After the mask is formed, the back surface side of the support substrate 211b is dipped in the strong alkaline solution such as TMAH, KOH or the like, and the support substrate 211b is anisotropically etched with the embedded insulating membrane 211a being used as an etching stopper. Thus, the through hole H is formed at the support substrate 211b. What is described above is the etching process.

After the through hole H is formed, the parts of the embedded insulating membrane 211a and the first oxidation membrane 112 which correspond to the thin-walled portion 120 (membrane structure) are removed. Specifically, the back surface side of the support substrate 211b is dipped in, for example, hydrofluoric acid liquid, so that the embedded insulating membrane 211a and the first oxidation membrane 112 are removed. Thus, the space S is provided, and the thin-walled portion 120 is formed at the substrate unit 110. That is, the membrane structure which is constructed of the thin-walled portion 120 and the piezoelectric oscillator 130 is formed. Moreover, the thin-walled portion 120 and the first adjustment electrode 141 are spaced from each other. What is described above is the spacing process.

According to the manufacture method of this embodiment, the ultrasonic sensor 100 (with reference to FIG. 7) where the predetermined voltage is applied between the first adjustment electrode 141 and the second adjustment electrode 142 can be manufactured.

In the second embodiment, the semiconductor substrate 111 having the SOI construction is used. The dopant impurity is introduced into the semiconductor layer 211c and the semiconductor layer 211c is provided with the patterning, so that the first adjustment electrode 141 is formed. Thus, the N+ diffusion field 111a and the pad 111b (which are used in first embodiment because insulating is provided through PN joining) become unnecessary.

Third Embodiment

A third embodiment of the present invention will be described with reference to FIGS. 10-12C.

Figure 10:
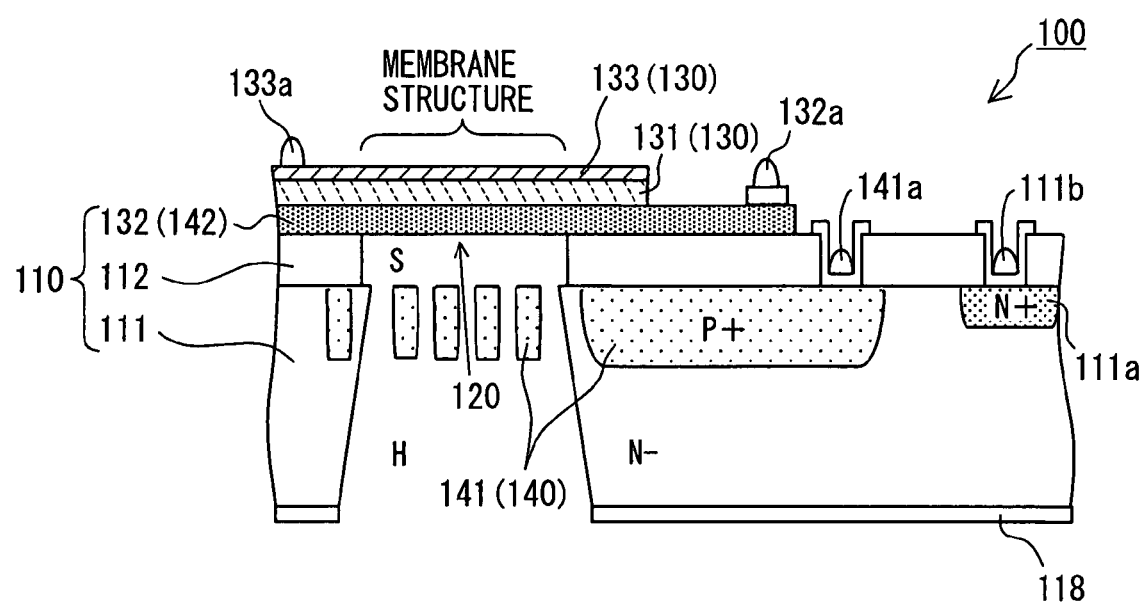
FIG. 10 is a partially sectional view showing an ultrasonic sensor according to a third embodiment of the present disclosure.

As shown in FIG. 10, the ultrasonic sensor 100 can be a piezoelectric type ultrasonic sensor which is manufactured by the MEMS technology. The ultrasonic sensor 100 has the substrate unit 110, the piezoelectric oscillator 130 which is arranged at the thin-walled portion 120 of the substrate unit 110, and the adjustment electrode unit 140 for applying the predetermined voltage to the thin-walled portion 120. According to the third embodiment, the adjustment electrode unit 140 has the first adjustment electrode 141 and the second adjustment electrode 142 which is also used as the lower detection electrode 132 of the piezoelectric oscillator 130.

Similarly to the first embodiment, the substrate unit 110 includes the semiconductor substrate 111 of the first conductive type. In this case, the semiconductor substrate 111 is constructed of the N-typed silicon substrate of the (100) plane orientation. The first adjustment electrode 141 as the diffusion field of the P-type conductivity is formed at the surface layer (of the side of piezoelectric oscillator 130) of the semiconductor substrate 111.

Moreover, the semiconductor substrate 111 has the through hole H which is positioned corresponding to the thin-walled portion 120. A part of the first adjustment electrode 141 is exposed to the inside of the through hole H. The first adjustment electrode 141 is provided with the lattice shape, in such a manner that the first adjustment electrode 141 partially blocks the through hole H. With reference to FIG. 10, the N+ diffusion field 111a is provided to insulate the semiconductor substrate 111 from the first adjustment electrode 141 by the PN joining.

Moreover, in addition to the semiconductor substrate 111, the substrate unit 110 further includes the first oxidation membrane 112 arranged on the semiconductor substrate 111, and the lower detection electrode 132 (of piezoelectric oscillator 130) which is arranged on the first oxidation membrane 112.

That is, in this case, the insulating membrane is constructed of the first oxidation membrane 112 which can be the silicon oxidation membrane and arranged at the surface (of the side of piezoelectric oscillator 130) of the semiconductor substrate 111. The lower detection electrode 132 constructed of the single-crystalline silicon where the dopant impurity (e.g., boron or phosphorus) is introduced is arranged on the first oxidation membrane 112.

The first oxidation membrane 112 functions as an etching stopper when the through hole H is formed at the semiconductor substrate 111. The part of the first oxidation membrane 112 which corresponds to the thin-walled portion 120 (of membrane structure) is removed, so that the space S is provided at the removed portion.

Thus, the part of the lower detection electrode 132 (stacked at first oxidation membrane 112) which is at the upper side of the space S, constructs the thin-walled portion 120. That is, the space S is positioned between the lower surface (lower detection electrode 132) of the thin-walled portion 120 and the first adjustment electrode 141, which are spaced from each other at least at the state where the piezoelectric oscillator 130 does not vibrate.

Thus, according to the third embodiment, the lower detection electrode 132 can function as the second adjustment electrode 142 and the thin-walled portion 120. About the ultrasonic sensor 100, what has not been described in the third embodiment is the same with the first embodiment.

According to the third embodiment, the predetermined voltage can be applied between the lower detection electrode 132 (second adjustment electrode 142) which constructs the thin-walled portion 120 and the first adjustment electrode 141 which is spaced from the thin-walled portion 120 through the space S. That is, the predetermined voltage can be applied to the thin-walled portion 120 of the membrane structure.

Thus, the membrane structure can be deformed (displaced), because the predetermined voltage is applied between the first adjustment electrode 141 and the lower detection electrode 132 (second adjustment electrode 142) to generate therebetween the electrostatic force (electrostatic attractive force) which has the contrary direction to the elastic restoring force of the membrane structure when the ultrasound is received.

Therefore, the resonance frequency of the membrane structure can be adjusted to have the desirable value, by substantially changing the spring constant of the membrane structure by the negative electrostatic spring effect.

In this embodiment, the first adjustment electrode 141 is spaced from the thin-walled portion 120 (membrane structure), and the thickness of the first adjustment electrode 141 is set larger than the thickness of the membrane structure. Thus, the displacement of the first adjustment electrode 141 can be restricted, and the membrane structure including the lower detection electrode 132 (second adjustment electrode 142) can be deformed. Thus, the deformation amount of the membrane structure can be increased. That is, the resonance frequency can be adjusted efficiently.

Moreover, according to this embodiment, because the predetermined voltage is not applied to the piezoelectric film 131 which constructs the piezoelectric oscillator 130 (that is, voluntary polarization of piezoelectric film 131 is not used), the resonance frequency can be controlled for a long time.

Furthermore, because the lower detection electrode 132 and the second adjustment electrode 142 are constructed of the single electrode, the construction of the ultrasonic sensor 100 can be simplified as compared with the first embodiment and the second embodiment.

According to the third embodiment, the lower detection electrode 132 (second adjustment electrode 142) can be constructed of the single-crystalline silicon in which the dopant impurity is introduced. Alternatively, similarly to the first embodiment, the lower detection electrode 132 (second adjustment electrode 142) can be also constructed of the polysilicon in which the dopant impurity is introduced. However, because there exists grain boundaries in the polysilicon membrane, crack easily occurs from the grain boundary as a starting point and develops along the grain boundary, together with the deformation of the membrane structure. Therefore, it is describable that the lower detection electrode 132 (second adjustment electrode 142) is constructed of the single-crystalline silicon where the grain boundary does not exits.

Next, the manufacture method of the ultrasonic sensor 100 will be described. FIGS. 11A-11D respectively show the first adjustment electrode manufacture process, the second silicon substrate preparing process, the bonding process, and a part (for forming lower detection electrode 132) of the oscillator manufacture process according to the manufacture method.

Figure 12A:
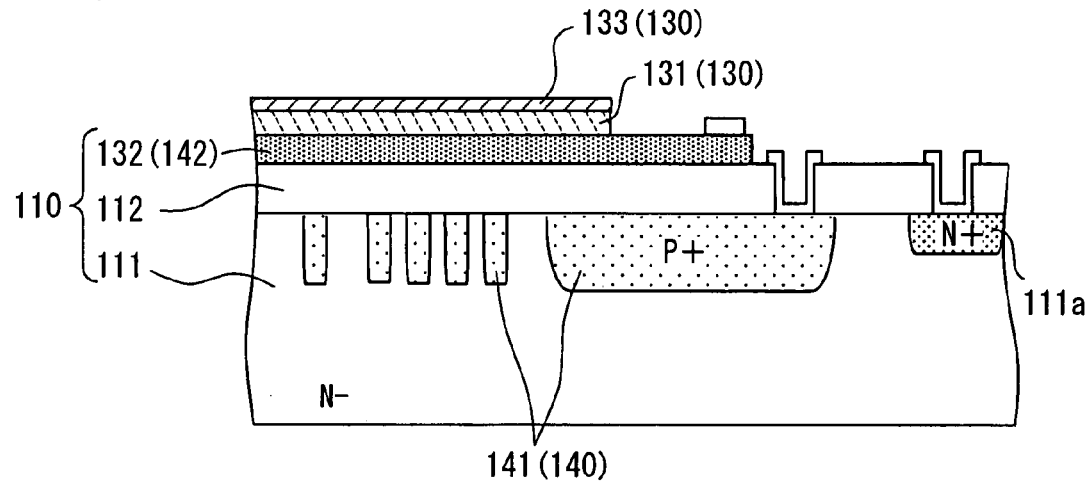
FIGS. 12A-12C are partially sectional views which respectively show the oscillator manufacture process, an etching process and a spacing process of the manufacture method of the ultrasonic sensor according to the third embodiment.
Figure 12B:
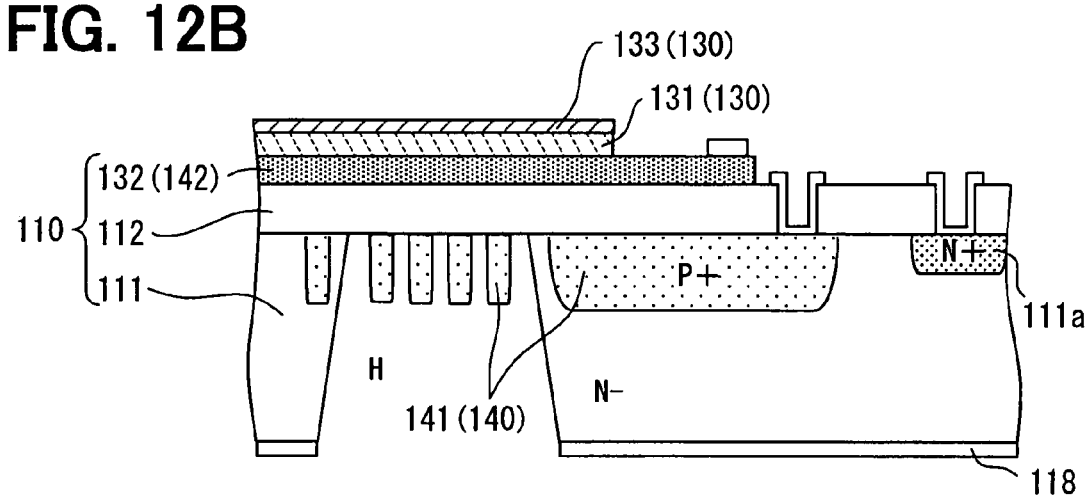
Figure 12C:
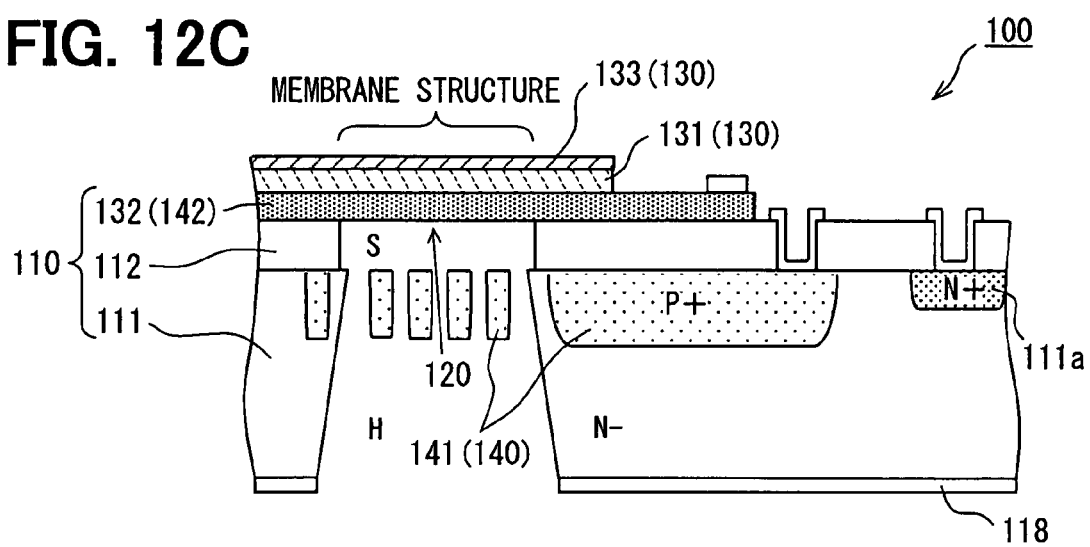

FIGS. 12A-12C respectively show the oscillator manufacture process, the etching process and the spacing process according to the manufacture method.

Figure 11A:
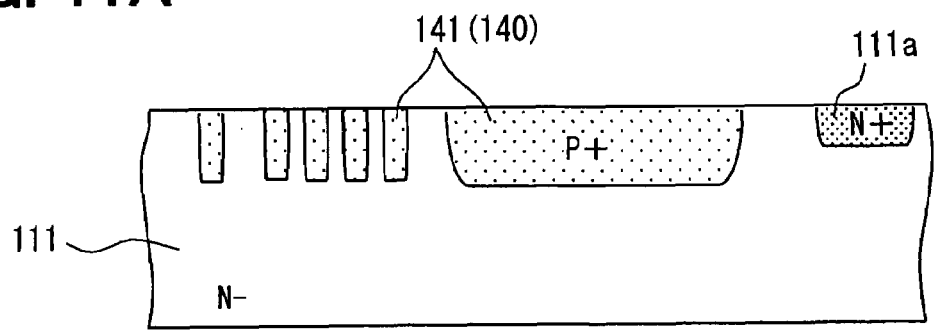
FIGS. 11A-11D are partially sectional views which respectively show a first adjustment electrode manufacture process, a second silicon substrate preparing process, a bonding process, and a part for manufacturing a lower detection electrode of an oscillator manufacture process of a manufacture method of the ultrasonic sensor according to the third embodiment.

At first, the first adjustment electrode manufacture process will be performed. As shown in FIG. 11A, the N-type silicon substrate of the (100) plane orientation is prepared as the semiconductor substrate 111 (first silicon substrate), and the first adjustment electrode 141 of the adjustment electrode unit 140 is formed at the surface layer (at the arrangement side of piezoelectric oscillator 130) of the semiconductor substrate 111. The process is the same as the first adjustment electrode manufacture process described in the first embodiment. Moreover, similarly to the first embodiment, the N+ diffusion field 111a for taking-out the potential is also formed at the semiconductor substrate 111, together with the forming of the first adjustment electrode 141.

Figure 11B:
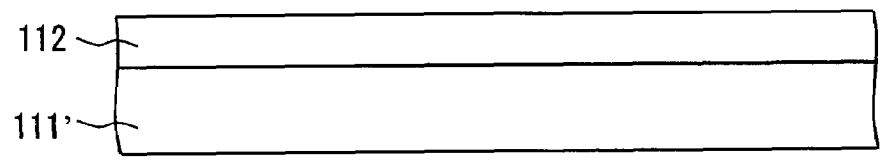
Figure 11C:
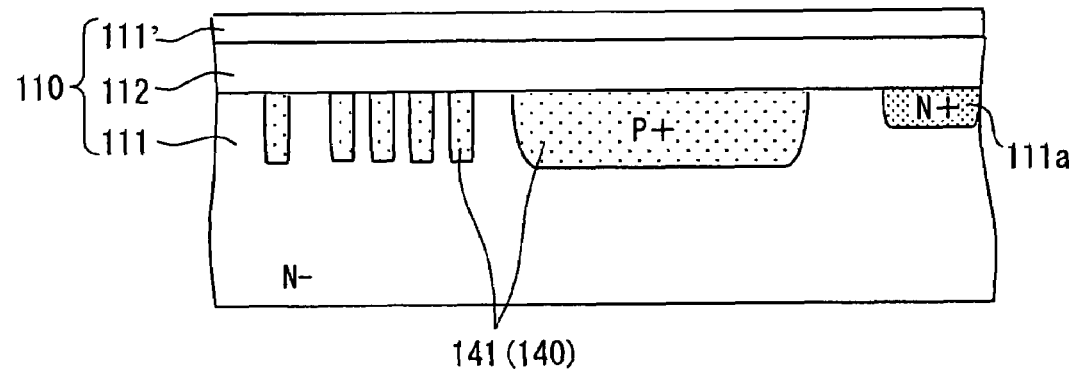
Figure 11D:
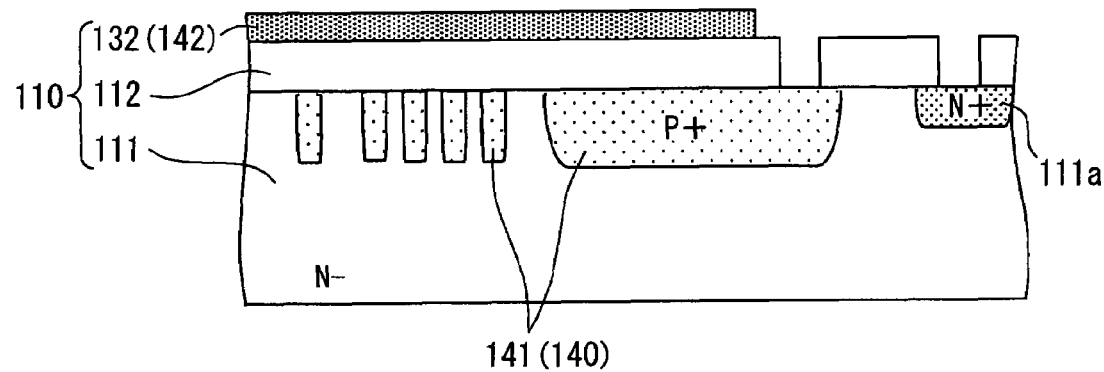

Moreover, according to the third embodiment, at the same time with the first adjustment electrode manufacture process, as shown in FIG. 11B, a second silicon substrate 111' is prepared and the first oxidation membrane 112 constructed of the silicon oxidation membrane is formed at the surface of the second silicon substrate 111'. In this embodiment, the first oxidation membrane 112 having the thickness of about 2 μm is formed by heat oxidation. In this case, the preparing of the second silicon substrate 111', can be performed before or after the forming of the first adjustment electrode 141. What is described above is the second silicon substrate preparing process.

Next, as shown in FIG. 1C, the second silicon substrate 111' is arranged at the surface of the semiconductor substrate 111 where the first adjustment electrode 141 is formed, in such a manner that the first oxidation membrane 112 contacts the forming surface of the first adjustment electrode 141. In this case, the first oxidation membrane 112 and the forming surface of the first adjustment electrode 141 are boned to each other.

Then, the second silicon substrate 111' is ground/polished from the surface thereof at the opposite side to the forming surface thereof of the first oxidation membrane 112, so that the thickness of the second silicon substrate 111' has the predetermined value. In this embodiment, the thickness of the second silicon substrate 111' (except first oxidation membrane 112) becomes about 1 μm by grinding/polishing. What is described above is the bonding process.

After the bonding process, the dopant impurity is introduced into the second silicon substrate 111' which has the predetermined thickness, and then the second silicon substrate 111' is provided with a heat treatment. The unwanted portion of the second silicon substrate 111' can be, for example, dry-etched, and provided with patterning to have the predetermined shape. Thus, as shown in FIG. 1D, the lower detection electrode 132 (second adjustment electrode 142) is formed. In this embodiment, the boron ion is injected at a dose amount $8 \times 10^{16}/cm^2$. Thereafter, the heat treatment (for example, for 2 h at 1150° C.) is performed. However, the dopant impurity injected to the second silicon substrate 111' is not limited to boron. For example, the dopant impurity can be phosphorus. What is described above is the part for forming the lower detection electrode 132, in the oscillator manufacture process.

In this case, the manufacture process of the lower detection electrode 132 corresponds to the second adjustment electrode manufacture process described in the first and the second embodiments. Moreover, in this process, the unwanted part of the first oxidation membrane 112 is, for example, dry-etched, and the first oxidation membrane 112 is provided with patterning. As shown in FIG. 1D, contact holes for the pads 141a and 111b are formed at the first oxidation membrane 112.

After the lower detection electrode 132 (second adjustment electrode 142) is formed, as shown in FIG. 12A, the piezoelectric film 131 and the upper detection electrode 133 are sequentially stacked on the lower detection electrode 132, to construct the piezoelectric oscillator 130. In this case, the construction and the manufacture method of the piezoelectric film 131 and the upper detection electrode 133 are the same as the first embodiment. What is described above is the piezoelectric oscillator manufacture process.

After the piezoelectric oscillator 130 is manufactured and the back surface of the semiconductor substrate 111 is ground/polished, the silicon nitride membrane 118 is formed at the back surface of the semiconductor substrate 111 by the plasma CVD method and the unwanted portion which corresponds to the forming portion of the thin-walled portion 120 is removed by dry etched, for example. Thus, as shown FIG. 12B, the through hole H is formed at the semiconductor substrate 111. The forming method of the through hole H is the same with the first embodiment. What is described above the etching process.

In the third embodiment, the part of the first adjustment electrode 141 which exists in the through hole H (that is, exists in forming field of membrane structure) has the lattice shape.

Thus, after the through hole H is formed, the part of the first oxidation membrane 112 which corresponds to the thin-walled portion 120 (membrane structure) is removed through the first adjustment electrode 141 having the lattice shape.

Specifically, the back surface side of the semiconductor substrate 111 is dipped in, for example, hydrofluoric acid liquid, so that the part of the first oxidation membrane 112 which corresponds to the thin-walled portion 120 (membrane structure) is removed. Thus, the space S is provided, and the thin-walled portion 120 is formed at the substrate unit 110.

That is, the membrane structure which is constructed of the thin-walled portion 120 (lower detection electrode 132) and the piezoelectric oscillator 130 is formed. Moreover, the thin-walled portion 120 and the first adjustment electrode 141 are spaced from each other. What is described above is the spacing process.

According to the manufacture method described in this embodiment, the ultrasonic sensor 100 (with reference to FIG. 10) where the first adjustment electrode 141 is provided for the adjustment electrode unit 140 and the predetermined voltage is applied between the lower detection electrode 132 and the first adjustment electrode 141 can be manufactured.

Moreover, because the lower detection electrode 132 and the second adjustment electrode 142 are constructed of the single electrode, the manufacture process can be simplified as compared with the constructions described in the first and second embodiments.

Fourth Embodiment

Figure 13:
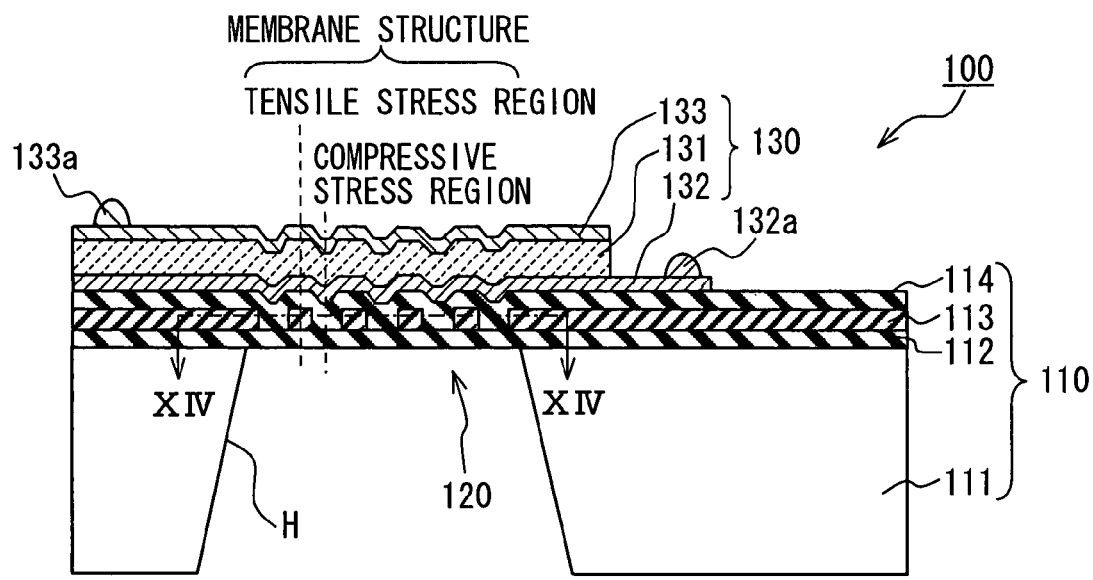
FIG. 13 is a partially sectional view showing an ultrasonic sensor according to a fourth embodiment of the present disclosure.

A fourth embodiment of the present invention will be described with reference to FIGS. 13-18B. As shown in FIG. 13, the ultrasonic sensor 100 has the substrate unit 110, and the piezoelectric oscillator 130 which is arranged at the thin-walled portion 120 of the substrate unit 110. In this case, the ultrasonic sensor 100 has the membrane structure which is constructed of the thin-walled portion 120 and the piezoelectric oscillator 130 and can resonate at a predetermined frequency.

The substrate unit 110 includes the semiconductor substrate 111, the first oxidation membrane 112, the nitride membrane 113, and the second oxidation membrane 114.

In this embodiment, the semiconductor substrate 111 is constructed of the N-typed silicon substrate of the (100) plane orientation. The semiconductor substrate 111 has the through hole H for constructing the thin-walled portion 120. The first oxidation membrane 112 is formed (as etching stopper) at the surface of the semiconductor substrate 111, in such a manner that one of the openings of the hole H is blocked.

The nitride membrane 113 is constructed of the silicon nitride membrane which is formed on the first oxidation membrane 112. It is known that the internal stress (membrane stress) of the silicon nitride membrane is the tensile stress in the state where the piezoelectric oscillator 130 does not vibrate (that is, in the state where ultrasound is not received or in the state where driving voltage for sending ultrasound is not applied). On the other hand, it is known that the internal stress of the silicon oxidation membrane is the compressive stress in the state where the piezoelectric oscillator 130 does not vibrate.

According to this embodiment, as shown in FIGS. 1 and 2, the forming field of the thin-walled portion 120 (construction field of membrane structure) at the first oxidation membrane 112 is partially covered by the nitride membrane 113 which is formed on the first oxidation membrane 112. That is, multiple through holes can be arranged at one part of the nitride membrane 113.

The second oxidation membrane 114 is constructed of the silicon oxidation membrane (used for protection) to cover the nitride membrane 113 and the part of the first oxidation membrane 112 which is positioned in the forming field of the thin-walled portion 120 and where the nitride membrane 113 is not arranged.

Thus, the part of the membrane structure where the nitride membrane 113 is formed constructs a tensile stress member (i.e., non-compressive stress region) where the internal stress is the tensile stress in the surface direction of the substrate unit 110.

The part of the membrane structure where the nitride membrane 113 is not formed constructs a compressive stress region where the internal stress is the compressive stress. Moreover, the internal stress of the whole of the thin-walled portion 120 and that of the whole of the membrane structure are adjusted to be the compressive stress by the first oxidation membrane 112, the nitride membrane 113 and the second oxidation membrane 114.

Figure 14:
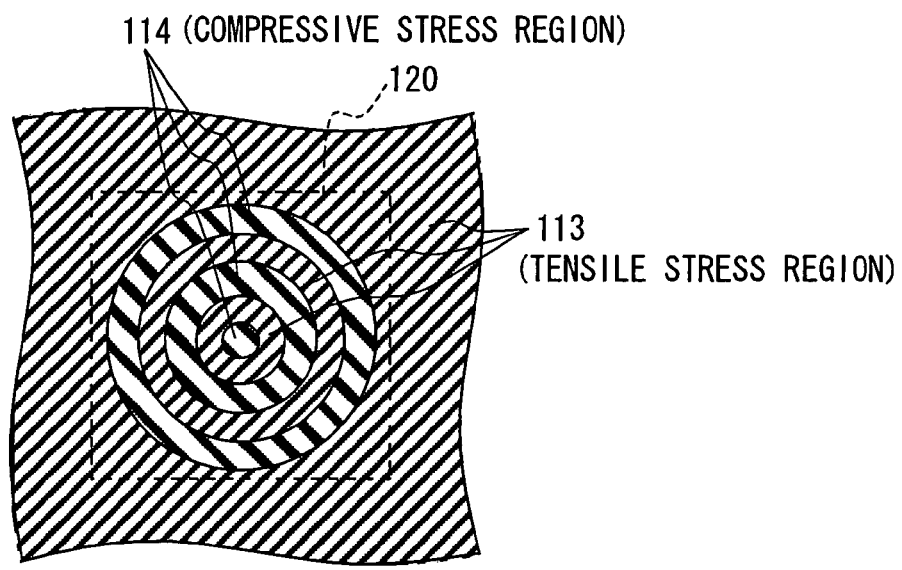
FIG. 14 is a schematic sectional view taken along a line XIV-XIV in FIG. 1.

Specifically, as shown in FIG. 14, the nitride membrane 113 has an annular portion (being rotational symmetry) which has an annular shape in the surface direction of the substrate unit 110 and whose center is a substantial center of the thin-walled portion 120 having a substantially square-shaped forming field (field surrounded by broken line in FIG. 14) in the surface direction of the substrate unit 110. In this case, the annular portion of the nitride membrane 113 includes multiple concentric annulations.

Moreover, in the surface direction of the substrate unit 110, a distance between the concentric annulations of the nitride membrane 113 which are adjacent to each other, that is, a width of the second oxidation membrane 114 which is arranged between the concentric annulations, is substantially equal to the width of the annulation of the nitride membrane 113. The each width is adjusted to be larger than or equal to the thickness of the membrane structure, and be smaller than or equal to three times the thickness of the membrane structure.

In this case, the thin-walled portion 120 is constructed of the parts of the first oxidation membrane 112, the nitride membrane 113, and the second oxidation membrane 114 which are positioned at the upper side of the through hole H of the semiconductor substrate 111. The thickness of the thin-walled portion 120 is not even with respect to the surface direction of the substrate unit 110. In this case, the part of the thin-walled portion 120 where the nitride membrane 113 is not arranged has a smaller thickness than the part where the nitride membrane 113 is arranged. That is, the part where the nitride membrane 113 is arranged has a concaved shape.

The piezoelectric film 131 of the piezoelectric oscillator 130 is arranged between the lower detection electrode 132 and the upper detection electrode 133. In this embodiment, the lower detection electrode 132, the piezoelectric film 131 and the upper detection electrode 133 are sequentially stacked at the upper side of the second oxidation membrane 114, to cover the thin-walled portion 120.

The piezoelectric film 131 can be made of PZT, aluminum nitride (AlN), zinc oxide (ZnO) or the like. The detection electrode 132, 133 can be made of platinum (Pt), gold (Au), aluminum (Al), and the like. In this embodiment, the piezoelectric film 131 is made of PZT. The detection electrode 132, 133 is made of Pt.

Figure 15A:
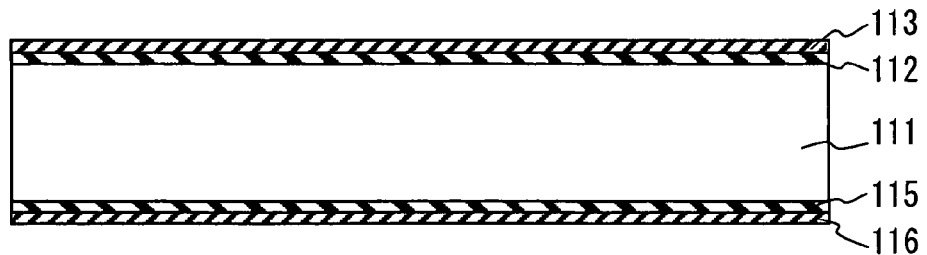
FIGS. 15A and 15B are partially sectional views which show a substrate manufacture process of a manufacture method of the ultrasonic sensor according to the fourth embodiment.
Figure 15B:
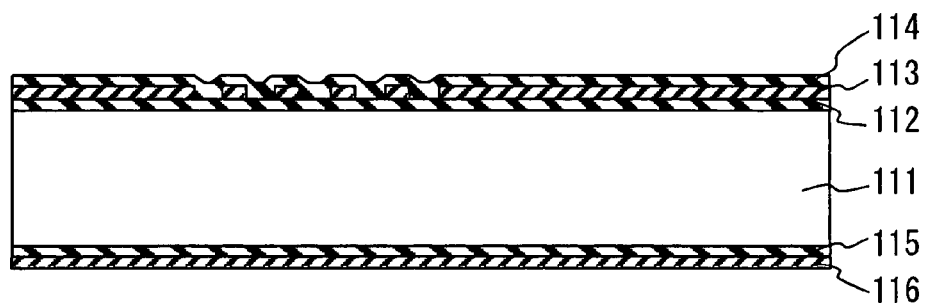
Figure 15C:
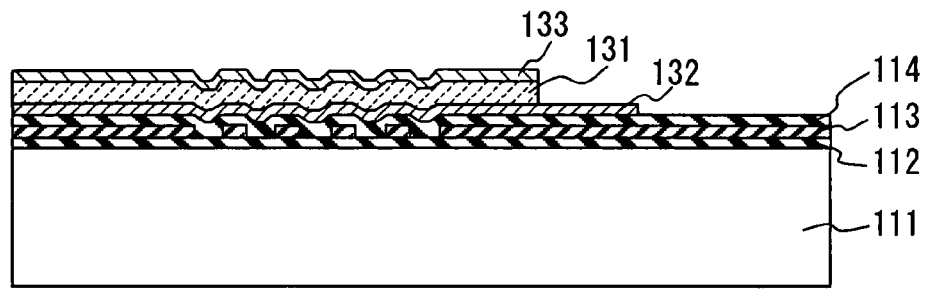
FIGS. 15C and 15D are partially sectional views which respectively show a piezoelectric element manufacture process and a membrane manufacture process of the manufacture method according to the fourth embodiment.

Next, the manufacture method of the ultrasonic sensor 100 according to the fourth embodiment will be described. FIGS. 15A, 15B and 15C respectively show the substrate manufacture process, the piezoelectric element manufacture process and the membrane manufacture process according to the manufacture method.

At first, as shown in FIG. 15A, the N-typed silicon substrate having the (100) plane orientation is prepared as the semiconductor substrate 111, and the silicon oxidation membrane as the first oxidation membrane 112 is arranged at the surface of the semiconductor substrate 111 by the heat oxidation.

In this case, the silicon oxidation membrane 115 is formed at the surface of the semiconductor substrate 111 which is at the opposite side to the first oxidation membrane 112, by the heat oxidation. According to this embodiment, the first oxidation membrane 112 having the thickness of about 0.3 μm can be formed.

After the first oxidation membrane 112 is formed, the silicon nitride membrane as the nitride membrane 113 is formed by LPCVD method. At this time, the silicon nitride membrane 116 is also formed at the surface of the silicon oxidation membrane 115. The silicon nitride membrane 116 and the semiconductor substrate 111 are respectively positioned at the two opposite sides of the silicon oxidation membrane 115.

According to this embodiment, the nitride membrane 113 which is formed by the LPCVD method can have a stoichiometric composition ($Si_3N_4$) and have a thickness of about 0.3 μm.

However, because it is difficult to increase the thickness of the membrane having the stoichiometric composition (for example, the membrane having stoichiometric composition will become broken at 1.2 GPa when the thickness thereof is 0.4 μm), the nitride membrane 113 having, for example, a silicon-rich composition, can be also formed. The internal stress (membrane stress) of the membrane having the silicon-rich composition is lower than that of the membrane having the stoichiometric composition, in the case where the membranes have the same thickness. However, the thickness of the membrane having the silicon-rich composition can be more increased as compared with the membrane having the stoichiometric composition. Therefore, the internal stress of the nitride membrane 113 can be adjusted to have the predetermined value by adjustment of the composition and the thickness of the nitride membrane 113.

Next, the unwanted portion (corresponding to compressive stress region) of the nitride film 113 is removed by dry etching, for example. Then, the nitride membrane 113 is provided with patterning to have a predetermined pattern as shown in FIG. 15B. Thus, in the forming field of the membrane structure (thin-walled portion 120), the compressive stress region and the tensile stress member including the nitride membrane 113 are constructed.

According to this embodiment, the width of the nitride membrane 113 which corresponds to the tensile stress member and has the multiple concentric annulations is set about 3.0 μm, and the distance between the adjacent annulations of the nitride membranes 113 is set about 3.0 μm.

After the patterning of the nitride membrane 113, the silicon oxidation membrane as the second oxidation membrane 114 is formed on the nitride membrane 113 and the part of the first oxidation membrane 112 which is positioned between the annulations of the nitride membrane 113, by the plasma CVD method. According to this embodiment, the second oxidation membrane 114 having the thickness of about 0.3 μm is formed. As described above, the substrate unit 110 is prepared.

After the second oxidation membrane 114 is formed, Pt membrane is stacked at the second oxidation membrane 114 by the evaporation method, and the unwanted portion is removed by dry etched, for example. Thus, as shown in FIG. 15C, the detection electrode 132 which is provided with patterning to cover the thin-walled portion 120 is formed. In this case, the detection electrode 132 can be provided with the thickness of about 0.25 μm.

After the detection electrode 132 is formed, the PZT membrane as the piezoelectric film 131 is formed on the detection electrode 132 by the sputter method, or the CVD method, or the sol-gel method or the like in such a manner that the PZT membrane covers the thin-walled portion 120, and the unwanted part thereof is removed by dry etching, for example. In this embodiment, the piezoelectric film 131 having the thickness of about 1.0 μm is formed by the sputter method.

After the piezoelectric film 131 is formed, the Pt membrane is stacked at the piezoelectric film 131 by the evaporation method, and the unwanted part thereof is removed by dry etching, for example. Thus, the detection electrode 133 which is provided with patterning to cover the thin-walled portion 120 is formed. In this embodiment, the detection electrode 133 having the thickness of about 0.25 μm is formed. What is described above is the piezoelectric oscillator manufacture process.

Thus, as described above, the piezoelectric oscillator 130 is formed. In this embodiment, the piezoelectric oscillator 130 can be constructed so that the internal stress thereof is substantial zero. However, as described in this embodiment, in the case where the internal stress of the piezoelectric oscillator 130 is not equal to zero, that is, the internal stress is the tensile stress or compressive stress, the thin-walled portion 120 can be suitable adjusted with respect to the internal stress of the piezoelectric oscillator 130. That is, the thin-walled portion 120 can be adjusted to apply an internal stress for countervailing the internal stress of the piezoelectric oscillator 130, so that the internal stress of the membrane structure can be adjusted.

After the piezoelectric oscillator 130 is formed, as shown in FIG. 15C, the surface (back surface) of the semiconductor substrate 111 which is at the opposite side to the piezoelectric oscillator 130 is ground/polished, and the silicon oxidation membrane 115 and the silicon nitride membrane 116 are removed.

Figure 15D:
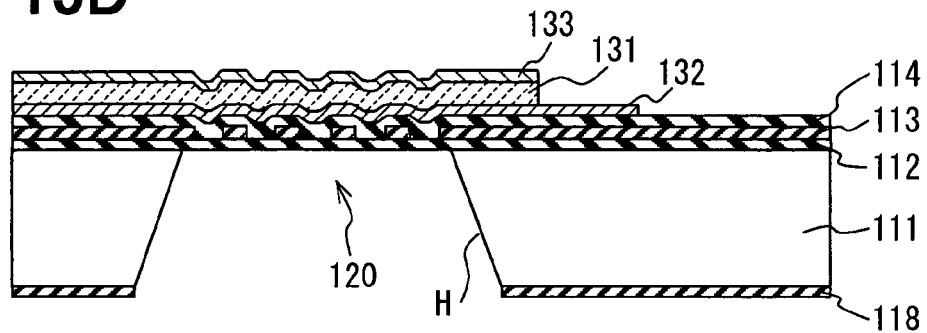

Thereafter, as shown in FIG. 15D, the silicon nitride membrane 118 is formed at the back surface of the semiconductor substrate 111 by the plasma CVD method, and the unwanted part of the silicon nitride membrane 118 which corresponds to the forming portion of the thin-walled portion 120 is removed by dry etching, for example. In this embodiment, the silicon nitride membrane 118 having the thickness of about 0.5 μm is formed, to construct a mask at etching. After the mask is formed, the back surface side of the semiconductor substrate 111 is dipped in the strong alkaline solution such as TMAH, or KOH or the like, and the semiconductor substrate 111 is anisotropically etched. Thus, the through hole H is formed at the semiconductor substrate 111, and the ultrasonic sensor 100 shown in FIG. 13 is formed.

Figure 16:
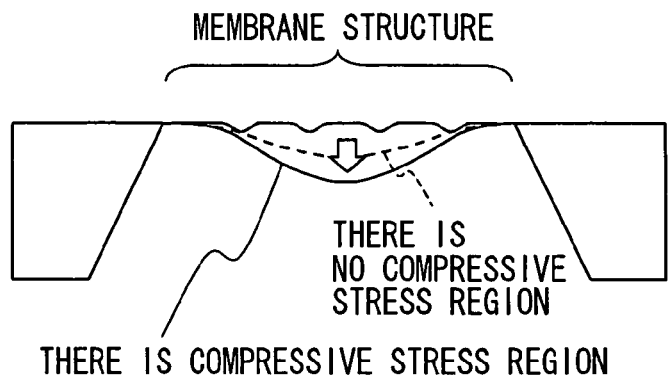
FIG. 16 is a schematic view showing an effect of the ultrasonic sensor according to the fourth embodiment.

Next, the effects of the ultrasonic sensor 100 according to this embodiment will be described with reference to FIG. 16, in which a deformation amount of an ultrasonic sensor without the compressive stress region (that is, ultrasonic sensor having nitride membrane 113 with membrane thickness which is substantially even in the whole forming field of the thick-walled portion) is indicated by broken line.

As described above, the internal stress of the whole of the membrane structure of the ultrasonic sensor 100 is adjusted to be the tensile stress. Thus, the membrane structure in the state where the piezoelectric oscillator 130 does not vibrate can be maintained to be substantially flat on the whole (that is, though a part of membrane structure may be buckled, the whole of the membrane structure is not buckled). Thus, the unevenness in the sensitivity of the ultrasonic sensor 100 can be reduced. That is, the variation in the deformation amount of the membrane structure when the ultrasound is received or sent can be reduced. That is, the variation in the shape of the membrane structure in the state where the piezoelectric oscillator 130 does not vibrate is relatively small (that is, reproducibility is improved), as compared with the ultrasonic sensor where the whole of the membrane structure is adjusted to have the compressive stress.

According to this embodiment, the ultrasonic sensor 100 has the compressive stress region as a part of the membrane structure (that is, a part of thin-walled portion 120). Because the compressive stress region is provided, the deformation amount (extension amount) will increase as a lantern or an accordion. Thus, as shown in FIG. 16, as compared with the ultrasonic sensor where the compressive stress region is not provided, the deformation amount of the membrane structure (having compressive stress region) when receiving the ultrasonic wave (or sending the ultrasonic wave) can be increased even in the case where the internal stresses of the whole of the membrane structures are the same.

That is, according to this embodiment, the sensitivity of the ultrasonic sensor 100 can be improved. Because the thickness of the forming portion of the compressive stress region is set to be thinner than the thickness of the forming portion of the tensile stress member, the stiffness of the compressive stress region can be decreased and the deformation amount can be enlarged as compared with a construction where the thickness of the compressive stress region is set equal to that of the tensile stress member.

However, the larger the forming range of the single compressive stress region which is partitioned by the tensile stress member, the buckling occurs more easily so that the effect for reducing the variation of the sensitivity of the ultrasonic sensor 100 becomes low.

In contrast, according to this embodiment, in the forming field of the membrane structure (the thin-walled portion 120), the nitride membrane 113 is provided with the multiple concentric annulations, and the compressive stress region and the tensile stress member are alternately arranged. Therefore, the range where the buckling can occur (that is, forming range of compressive stress region) is restrained. That is, the shape reproducibility of the membrane structure in the state where the piezoelectric oscillator 130 does not vibrate is improved due to the concentric annulations of the tensile stress members which are alternately arranged. Moreover, the deformation amount of the membrane structure when the ultrasonic wave is received (or the ultrasonic wave is sent) is increased due to the compressive stress region.

Moreover, the deformation amount of the membrane structure when the ultrasound is received (or ultrasound is sent) becomes larger at a portion which is nearer the center of the membrane structure in the surface direction of the substrate unit 110, and becomes smaller at a portion which is further from the center.

According to this embodiment, the tensile stress member is provided with the multiple concentric annulations which is rotational symmetry and has the center substantially coinciding with the center of the thin-walled portion 120. Because the multiple annulations are provided, the deformation amount of the membrane structure when the ultrasonic wave is received (or the ultrasonic wave is sent) can be increased.

Alternatively, the shape of the tensile stress member in the surface direction of the substrate unit 110 can be also different from the concentric-circle shape. For example, according to a modification of the fourth embodiment with reference to FIG. 17 (which is a sectional view taken along a position of the ultrasonic sensor 100 corresponding to that of FIG. 14), the annulation of the tensile stress member can be also arranged along the deformation shape of the membrane structure when the piezoelectric oscillator 130 vibrates.

Figure 17:
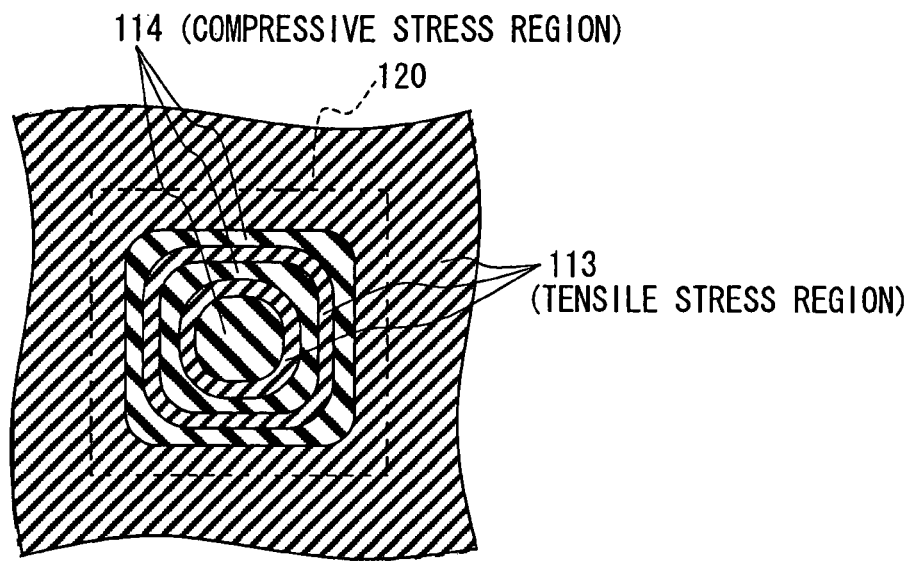
FIG. 17 is a sectional view showing an ultrasonic sensor according to a modification of the fourth embodiment.

As shown in FIG. 17, in the case where the thin-walled portion 120 is provided with the substantial square shape, the shape of the annulation of the nitride membrane 113 (tensile stress member) can be changed from the substantial circle shape at the center side thereof to the substantial square shape at the periphery side thereof. In this case, the annulations are concentrically arranged. The part of the second oxidation membrane 114 (compressive stress region) which is arranged between the annulations of the nitride membrane 113 has a shape corresponding to the shapes of the annulations of the nitride membrane 113. Thus, in the case where the construction of the membrane structure shown in FIG. 17 is used, the deformation amount of the membrane structure when the ultrasonic wave is received (or the ultrasonic wave is sent) can be increased.

Moreover, according to the fourth embodiment, the width (e.g., 3.0 µm) of the annulation of the tensile stress member and the width (e.g., 3.0 µm) of the portion of the compressive stress region which is arranged between the annulations of the tensile stress members are exampled to be larger than or equal to the thickness (e.g., 2.4 µm) of the membrane structure, and be smaller than or equal to three times the thickness of the membrane structure. In this case, the width is a dimension in the surface direction of the substrate unit 110.

Figure 18A:
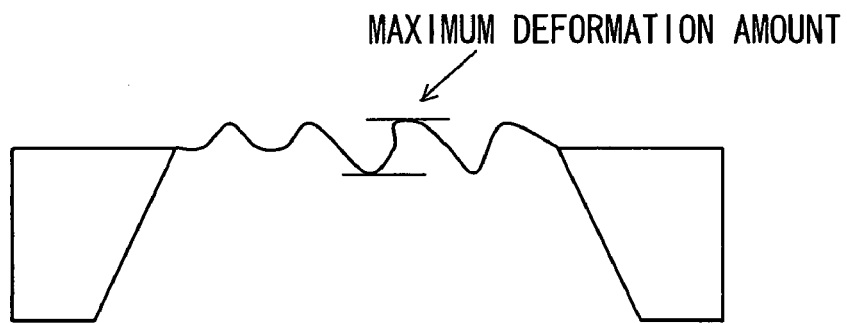
FIG. 18A is a schematic view showing a maximum deformation amount of a membrane structure in the state where a piezoelectric oscillator does not vibrate.
Figure 18B:
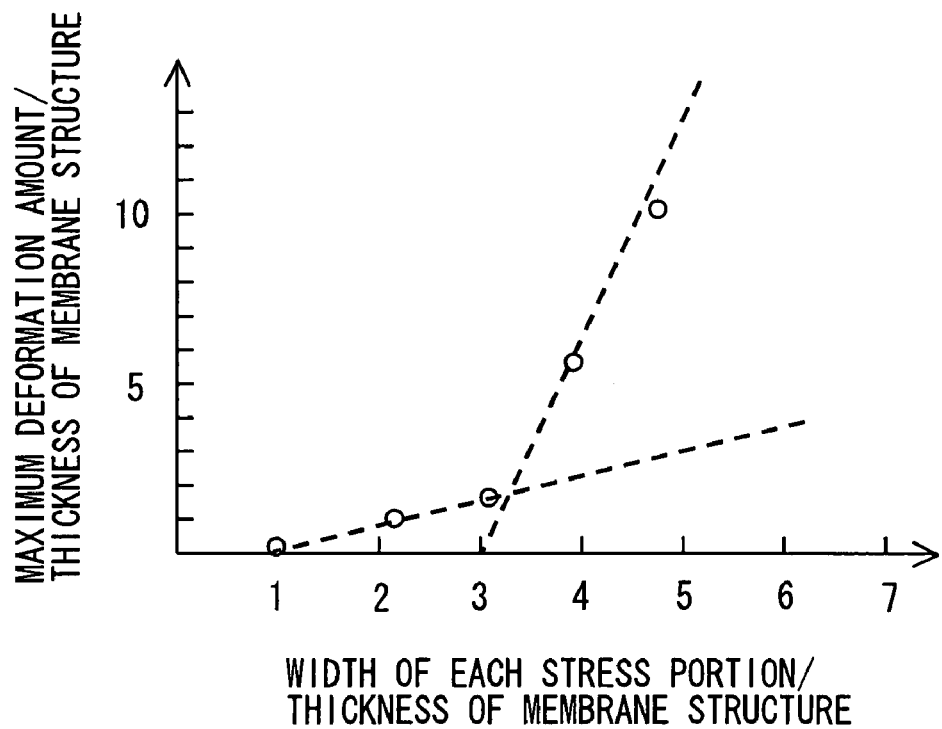
FIG. 18B is a graph showing a simulation result of a relation between a width of each stress portion and the maximum deformation amount of the membrane structure.

FIG. 18A shows the maximum deformation amount (local maximum buckling amount) of the membrane structure in the state where the piezoelectric oscillator does not vibrate. FIG. 18B shows a simulation result of the relation between the width of each of the stress portions (tensile stress member and compressive stress region) and the maximum deformation amount of the membrane structure.

When each of these widths is set to be smaller than the thickness of the membrane structure, as shown in FIG. 18B, the effect of the deformation amount of the compressive stress region will disappear and the deformation amount of the membrane structure when the ultrasonic wave is received (or the ultrasonic wave is sent) can not be increased. Moreover, when the each of these widths is larger than three times the thickness of the membrane structure, as shown in FIG. 18B, the deformation amount of the membrane structure (local deformation amount due to compressive stress region (that is, buckling)) in the state where the piezoelectric oscillator 130 does not vibrate becomes larger as compared with the case where the width is smaller than or equal to three times the thickness of the membrane structure.

Therefore, when the width of the annulation of the tensile stress member and the width of the portion of the compressive stress region which is arranged between the annulations of the tensile stress members are set larger than or equal to the thickness of the membrane structure, and smaller than or equal to three times the thickness of the membrane structure, the deformation amount of the membrane structure when the ultrasonic wave is received (or sent) can be increased and the variation in the sensor sensitivity can be decreased.

In this embodiment, the width of the annulation of the tensile stress member is exampled to be substantially equal to the width of the portion of the compressive stress region which is arranged between the annulations of the tensile stress members. Alternatively, the width of the annulation of the tensile stress member can be also set different from the width of the portion of the compressive stress region which is arranged between the annulations of the tensile stress members.

Fifth Embodiment

Next, a fifth embodiment of the present invention will be described with reference to FIG. 19 which is a sectional view taken along a position of the ultrasonic sensor 100 corresponding to that of FIG. 14.

According to the above-described fourth embodiment, the tensile stress member of the membrane structure is shaped to have the concentric annulations, which are rotational symmetry and have the center coinciding with that of the thin-walled portion 120 in the surface direction of the substrate unit 110. According to the fifth embodiment, in addition to the above-described annulations, the tensile stress member further has connection portions 113a each of which intersects (at right angle, for example) the annulation in the same surface and connects the adjacent annulations with each other.

Figure 19:
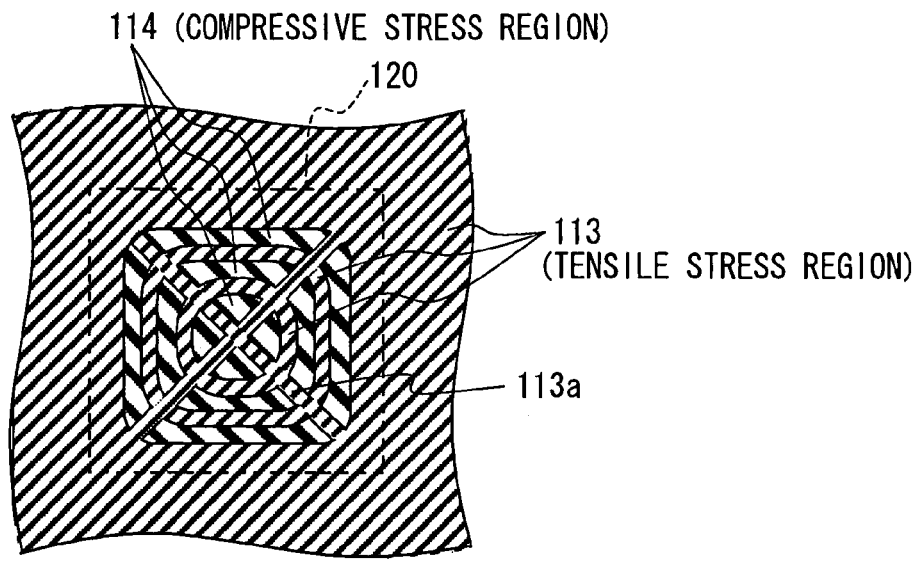
FIG. 19 is a schematic sectional view showing an ultrasonic sensor according to a fifth embodiment of the present disclosure.

Specifically, as shown in FIG. 19, the multiple annulations of the nitride membranes 113 which constructs the tensile stress members are shaped to be along the deformation shape of the membrane structure, in the forming field of the membrane structure. The nitride membrane 113 is provided with the annulations (as shown in FIG. 17) which are rotational symmetry with respect to the center coinciding with that of the thin-walled portion 120, and the connection portions 113a (that is, connection portion of membrane structure) each of which is shaped in the diagonal line of the membrane structure (thin-walled portion 120) having the substantial square. Thus, the annulations of the nitride membrane 113 which are adjacent to each other are partially connected with each other by the connection portion 113a.

Because the connection portion 113a is formed as a part of the tensile stress member, the buckling due to the compressive stress region in the state where the piezoelectric oscillator 130 does not vibrate can be reduced, as compared with the construction where the connection portion 113a is not provided. That is, the variation in the sensitivity of the ultrasonic sensor 100 can be further reduced as compared with the construction described in the fourth embodiment. Particularly, according to the fifth embodiment, at least one part of the connection portion 113a is formed to reach the end portion of the membrane structure. Thus, the buckling due to the compressive stress region can be further restricted.

Figure 20:
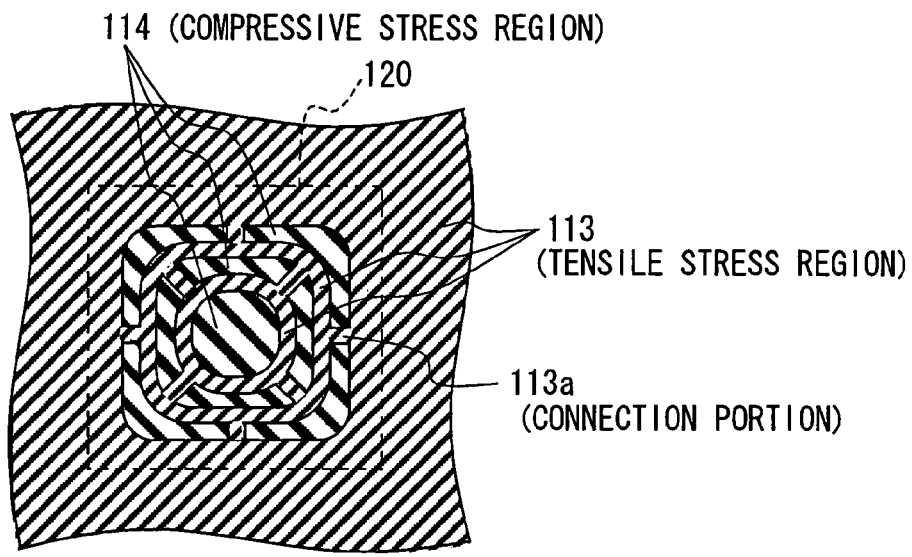
FIG. 20 is a schematic sectional view showing an ultrasonic sensor according to a modification of the fifth embodiment.

In the fifth embodiment, the connection portion (the connection portion 113a of nitride membrane 113) of the tensile stress member is exampled to be formed along the diagonal line of the membrane structure (the thin-walled portion 120) having the substantial square. However, the arrangement of the connection portion is not limited to this. For example, the connection portion can be constructed to at least partially connect the annulations which are adjacent to each other. For example, according to a modification of the fifth embodiment with reference to FIG. 20, the connection portion 113a of the nitride membrane 113 can be constructed to be along the line which connects the middle points of the edges of the substantial square in the surface direction of the substrate unit 110.

Other Embodiment

Although the present invention has been fully described in connection with the preferred embodiments thereof with reference to the accompanying drawings, it is to be noted that various changes and modifications will become apparent to those skilled in the art.

The purport of the present invention is to apply the predetermined voltage only to the thin-walled portion of the membrane structure to generate the electrostatic force so that the resonance frequency can be adjusted by displacing (deforming) the whole of the membrane structure by the electrostatic force. Various modifications which do not deviate from this purport can be embodied.

For example, the number of the membrane structures each of which is constructed of the substrate unit 110 is not limited. The each membrane structure is constructed as a single ultrasonic element. For example, the above-described present invention can be suitably used for each of the membrane structures which is constructed of the substrate unit 110. Moreover, for an ultrasonic sensor where the multiple membrane structures are arrayed at the single substrate unit 110, the resonance frequencies of the membrane structures can be respectively adjusted as described in the present invention to reduce the unevenness in the resonance frequencies thereof. That is, the multiple membrane structures can be constructed to respectively have the resonance frequencies which have the substantially same value due to the applying of the predetermined voltage.

In the above-described embodiments, the semiconductor substrate 111 which is made of the silicon is provided as the substrate unit 110. Thus, the semiconductor substrate 111 can be manufactured with a low cost by a general semiconductor manufacture technology. However, a semiconductor substrate having a SOI structure or a substrate which is constructed of a material other than the semiconductor substrate can be also used.

Moreover, as examped in the above-described embodiments, the tensile stress member and the compressive stress region are distinguished from each other according to whether or not the nitride membrane 113 (tensile stress layer in which internal stress is tensile stress) exists. In this case, the groove or the through hole is arranged at a part of the tensile stress layer. However, the tensile stress member is not limited to the nitride membrane. Moreover, the tensile stress member and the compressive stress region can be also distinguished from each other according to the thickness of the tensile stress layer, not according to whether or not the tensile stress layer exits.

Furthermore, in the above-described embodiments, the internal stress of the whole of the membrane structure is adjusted to be the tensile stress. However, the internal stress of the whole of the membrane structure can be also adjusted to be substantial zero. That is, the whole of the membrane structure can be adjusted so that the internal stress thereof is substantially zero.

Moreover, as examped in the above-described embodiments, the tensile stress member and the compressive stress region are alternately arranged in the forming field of the membrane structure. However, the arrangement of the compressive stress region is not limited to this. For example, the compressive stress region can be also formed in at least a part of the forming field of the membrane structure. Thus, the deformation amount of the membrane structure when the ultrasound is received (or sent) can be increased, as compared with the construction where the compressive stress region is not provided.

Moreover, as examped in the above-described embodiments, the thickness of the forming portion of the compressive stress region can be set to be thinner than the thickness of the forming portion of the tensile stress member. That is, the thickness of the one part of the membrane structure (thin-walled portion 120) is thinner than that of the other part of the membrane structure. However, the portion whose thickness is thinner is not limited to the forming portion of the compressive stress region. For example, the internal stress of the whole of the membrane structure can be adjusted to be the tensile stress or zero, and a concave portion can be formed at the one part of the thin-walled portion 120. In this case, the forming portion of the concave portion can have a thickness which is smaller than the other part of the thin-walled portion 120. Thus, the internal stress of the whole of the membrane structure is the same so that the stiffness of the concave portion can become partially low (that is, internal stress becomes low in the compressive direction), as compared with the construction where the thickness of the thin-walled portion 120 is even. Therefore, the deformation amount of the membrane structure when the ultrasonic wave is received (sent) can be increased. That is, the sensitivity of the ultrasonic sensor 100 can be improved.

Such changes and modifications are to be understood as being in the scope of the present invention as defined by the appended claims.

What is claimed is:

1. An ultrasonic sensor, comprising:
a substrate unit including a thin-walled portion which is arranged at a part thereof and has a smaller thickness than other part thereof;
a piezoelectric oscillator which includes two detection electrodes and a piezoelectric film positioned between the detection electrodes in a thickness direction of the substrate unit, the piezoelectric oscillator and the thin-walled portion constructing a membrane structure; and
an adjustment electrode unit for applying a predetermined voltage to the thin-walled portion, wherein
the membrane structure is provided with a negative electrostatic spring effect due to the predetermined voltage.

2. The ultrasonic sensor according to claim 1, wherein:
the adjustment electrode unit includes a first adjustment electrode and a second adjustment electrode; and
the predetermined voltage is applied between the first adjustment electrode and the second adjustment electrode.

3. The ultrasonic sensor according to claim 2, wherein:
the substrate unit has a semiconductor substrate of a first conductivity type and an insulating membrane including multiple insulator layers which are stacked at a surface of the semiconductor substrate, the surface being at a side of the piezoelectric oscillator;
the first adjustment electrode is constructed as a diffusion field of a second conductivity type which is contrary to the first conductivity type, the diffusion field being arranged at a surface region of the semiconductor substrate, the surface region being at a side of the piezoelectric oscillator;
the second adjustment electrode is sandwiched between the insulating membranes in the thickness direction of the substrate unit;

a part of the semiconductor substrate which is positioned corresponding to a forming field of the thin-walled portion is removed with the first adjustment electrode being remained, and at least a part of the insulating membrane which contacts with a surface of the semiconductor substrate and is positioned corresponding to the forming field of the thin-walled portion is removed; and the first adjustment electrode and the membrane structure which includes the second adjustment electrode are spaced from each other.

4. The ultrasonic sensor according to claim 3, wherein:
the semiconductor substrate is made of a silicon;
the first conductivity type is a N-typed conductivity; and
the second conductivity type is a P-typed conductivity.

5. The ultrasonic sensor according to claim 4, wherein
a thickness of the first adjustment electrode is larger than that of the membrane structure in the thickness direction of the substrate unit.

6. The ultrasonic sensor according to claim 5, wherein:
a plurality of the membrane structures are provided; and
the predetermined voltage is applied to each of the thin-walled portions of the membrane structures.

7. The ultrasonic sensor according to claim 6, wherein
resonance frequencies of the plurality of the membrane structures are substantially equal to each other, due to an applying of the predetermined voltage.

8. The ultrasonic sensor according to claim 3, wherein
a thickness of the first adjustment electrode is larger than that of the membrane structure in the thickness direction of the substrate unit.

9. The ultrasonic sensor according to claim 2, wherein:
the substrate unit has a semiconductor-on-insulator substrate which is constructed of a support semiconductor substrate and a semiconductor layer arranged at the support semiconductor substrate through an embedded insulating layer, and an insulating membrane including multiple insulator layers which are stacked at a surface of the semiconductor-on-insulator substrate, the surface being at a side of the piezoelectric oscillator;
the first adjustment electrode is constructed of a semiconductor layer in which dopant impurities are provided;
the second adjustment electrode is sandwiched between the insulating membranes in the thickness direction of the substrate unit;
a part of the semiconductor substrate which is positioned corresponding to a forming field of the thin-walled portion is removed with the first adjustment electrode being remained, and at least a part of the insulating membrane which contacts a surface of the semiconductor substrate and is positioned corresponding to the forming field of the thin-walled portion is removed; and
the first adjustment electrode and the membrane structure which includes the second adjustment electrode are spaced from each other.

10. The ultrasonic sensor according to claim 2, wherein:
the adjustment electrode unit has two adjustment electrodes; and
one of the two adjustment electrodes is spaced from the membrane structure.

11. The ultrasonic sensor according to claim 10, wherein:
the adjustment electrode unit includes a first adjustment electrode and a second adjustment electrode; and
the predetermined voltage is applied between the first adjustment electrode and the second adjustment electrode.

12. The ultrasonic sensor according to claim 11, wherein:
the substrate unit has a semiconductor substrate of a first conductivity type and an insulating membrane including multiple insulator layers which are stacked at a surface of the semiconductor substrate, the surface being at a side of the piezoelectric oscillator;
the first adjustment electrode is constructed as a diffusion field of a second conductivity type which is contrary to the first conductivity type, the diffusion field being arranged at a surface region of the semiconductor substrate, the surface region being at a side of the piezoelectric oscillator;
the second adjustment electrode is sandwiched between the insulating membranes in the thickness direction of the substrate unit;
a part of the semiconductor substrate which is positioned corresponding to a forming field of the thin-walled portion is removed with the first adjustment electrode being remained, and at least a part of the insulating membrane which contacts with a surface of the semiconductor substrate and is positioned corresponding to the forming field of the thin-walled portion is removed; and
the first adjustment electrode and the membrane structure which includes the second adjustment electrode are spaced from each other.

13. The ultrasonic sensor according to claim 12, wherein:
the semiconductor substrate is made of a silicon;
the first conductivity type is a N-typed conductivity; and
the second conductivity type is a P-typed conductivity.

14. The ultrasonic sensor according to claim 1, wherein
the adjustment electrode unit includes a first adjustment electrode; and
a predetermined voltage is applied between the first adjustment electrode and one of the two detection electrodes which is positioned at a side of the substrate unit.

15. The ultrasonic sensor according to claim 14, wherein:
the substrate unit has a semiconductor substrate of a first conductivity type and an insulating membrane which is arranged at a surface of the semiconductor substrate, the surface being at a side of the piezoelectric oscillator;
the first adjustment electrode is constructed as a diffusion field of a second conductivity type which is contrary to the first conductivity type, the diffusion field being arranged at a surface region of the semiconductor substrate, the surface region being at a side of the piezoelectric oscillator;
a part of the semiconductor substrate which is positioned corresponding to a forming field of the thin-walled portion is removed with the first adjustment electrode being remained, and at least a part of the insulating membranes which contacts a surface of the semiconductor substrate and is positioned corresponding to the forming field of the thin-walled portion is removed; and
the first adjustment electrode and the membrane structure are spaced from each other.

16. The ultrasonic sensor according to claim 15, wherein:
the semiconductor substrate is made of a silicon;
the first conductivity type is a N-typed conductivity; and
the second conductivity type is a P-typed conductivity.

17. The ultrasonic sensor according to claim 16, wherein
the one of the two detection electrodes which is positioned at the side of the substrate unit is constructed of a single-crystalline silicon in which dopant impurities are provided.

18. The ultrasonic sensor according to claim 15, wherein a thickness of the first adjustment electrode is larger than that of the membrane structure in the thickness direction of the substrate unit.

19. The ultrasonic sensor according to claim 1, wherein:
a plurality of the membrane structures are provided; and
the predetermined voltage is applied to each of the thin-walled portions of the membrane structures.

20. The ultrasonic sensor according to claim 19, wherein resonance frequencies of the plurality of the membrane structures are substantially equal to each other, due to an applying of the predetermined voltage.

21. An ultrasonic sensor, comprising:
a substrate unit including a thin-walled portion which is arranged at a part thereof and has a smaller thickness than other part thereof; and
a piezoelectric oscillator which includes two electrodes and a piezoelectric film positioned between the two electrodes, the piezoelectric oscillator being arranged at the thin-walled portion, wherein:
the thin-walled portion and the piezoelectric oscillator construct a membrane structure which has a predetermined resonance frequency;
the membrane structure is adjusted so that an internal stress of the membrane structure when the piezoelectric oscillator does not vibrate is a tensile stress or substantial zero on the whole; and
the thin-walled portion includes a concave portion, which is arranged at a part of the thin-walled portion and has a smaller thickness than other part thereof.

22. The ultrasonic sensor according to claim 21, wherein a part of the membrane structure which corresponds to the concave portion is a compressive stress region in which the internal stress when the piezoelectric oscillator does not vibrate is a compressive stress in a surface direction of the substrate unit.

23. The ultrasonic sensor according to claim 22, wherein:
the membrane structure has a non-compressive stress region which is constructed of a part of the membrane structure other than the part thereof where the compressive stress region is arranged; and
the non-compressive stress region and the compressive stress region are alternately arranged at the membrane structure in the surface direction of the substrate unit.

24. The ultrasonic sensor according to claim 23, wherein the non-compressive stress region has multiple annulations which are rotational symmetry and have a center coinciding with a center of the thin-walled portion in the surface direction of the substrate unit.

25. The ultrasonic sensor according to claim 24, wherein the annulations are concentrically arranged and have a circle shape.

26. The ultrasonic sensor according to claim 24, wherein the annulation is arranged along a deformation shape of the membrane structure when the piezoelectric oscillator vibrates.

27. The ultrasonic sensor according to claim 24, wherein the non-compressive stress region has a connection portion which is orthogonal to the annulations in a same surface and connects the adjacent annulations with each other.

28. The ultrasonic sensor according to claim 27, wherein at least one part of the connection portion extends to an edge of the membrane structure.

29. The ultrasonic sensor according to claim 23, wherein each of widths of the compressive stress region and the non-compressive stress region is larger than or equal to a thickness of the membrane structure, and smaller than or equal to three times the thickness of the membrane structure.

30. The ultrasonic sensor according to claim 21, wherein:
the thin-walled portion includes a tensile stress layer in which an internal stress is a tensile stress when the piezoelectric oscillator does not vibrate; and
at least one of a groove and a through hole is arranged at a part of the tensile stress layer.

31. The ultrasonic sensor according to claim 30, wherein:
the thin-walled portion includes the tensile stress layer and a compressive stress layer in which an internal stress is a compressive stress when the piezoelectric oscillator does not vibrate, the tensile stress layer and the compressive stress layer being stacked; and
a part of the compressive stress layer is arranged in the at least one of the groove and the through hole of the tensile stress layer.

32. The ultrasonic sensor according to claim 30, wherein:
the substrate unit includes a silicon substrate; and
the tensile stress layer is constructed of a silicon nitride layer.

33. The ultrasonic sensor according to claim 31, wherein:
the substrate unit includes a silicon substrate; and
the tensile stress layer is constructed of a silicon nitride layer.

34. An ultrasonic sensor comprising:
a substrate unit including a thin-walled portion which is arranged at a part thereof and has a smaller thickness than other part thereof; and
a piezoelectric oscillator which includes two electrodes and a piezoelectric film positioned between the two electrodes, the piezoelectric oscillator being arranged at the thin-walled portion, wherein:
the thin-walled portion and the piezoelectric oscillator construct a membrane structure which has a predetermined resonance frequency;
an internal stress of the membrane structure in a state where the piezoelectric oscillator does not vibrate is a tensile stress or substantial zero on the whole; and
the membrane structure has a compressive stress region, in which an internal stress is a compressive stress in a surface direction of the substrate unit when the piezoelectric oscillator does not vibrate.

35. The ultrasonic sensor according to claim 34, wherein:
the membrane structure has a non-compressive stress region which is constructed of a part of the membrane structure other than the part thereof where the compressive stress region is arranged; and
the non-compressive stress region and the compressive stress region are alternately arranged at the membrane structure in the surface direction of the substrate unit.

36. The ultrasonic sensor according to claim 35, wherein the non-compressive stress region has multiple annulations which are rotational symmetry and have a center coinciding with a center of the thin-walled portion in the surface direction of the substrate unit.

37. The ultrasonic sensor according to claim 36, wherein the annulation is arranged along a deformation shape of the membrane structure when the piezoelectric oscillator vibrates.

38. The ultrasonic sensor according to claim 37, wherein the non-compressive stress region has a connection portion which is orthogonal to the annulations in a same surface and connects the adjacent annulations with each other.

39. The ultrasonic sensor according to claim 38, wherein at least one part of the connection portion extends to an edge of the membrane structure.

40. The ultrasonic sensor according to claim 39, wherein each of widths of the compressive stress region and the non-compressive stress region is larger than or equal to a thickness of the membrane structure, and smaller than or equal to three times the thickness of the membrane structure.

41. The ultrasonic sensor according to claim 40, wherein:
the thin-walled portion includes a tensile stress layer in which an internal stress is a tensile stress when the piezoelectric oscillator does not vibrate; and
at least one of a groove and a through hole is arranged at a part of the tensile stress layer.

42. The ultrasonic sensor according to claim 41, wherein:
the thin-walled portion includes the tensile stress layer and a compressive stress layer in which an internal stress is a compressive stress when the piezoelectric oscillator does not vibrate, the tensile stress layer and the compressive stress layer being stacked; and
a part of the compressive stress layer is arranged in the at least one of the groove and the through hole of the tensile stress layer.

* * * * *